(12) United States Patent
Suto et al.

(10) Patent No.: US 11,978,794 B2
(45) Date of Patent: May 7, 2024

(54) SILICON CARBIDE SEMICONDUCTOR DEVICE, POWER CONVERSION DEVICE, THREE-PHASE MOTOR SYSTEM, AUTOMOBILE, AND RAILWAY VEHICLE

(71) Applicant: Hitachi, Ltd., Tokyo (JP)

(72) Inventors: Takeru Suto, Tokyo (JP); Naoki Tega, Tokyo (JP); Naoki Watanabe, Tokyo (JP); Yuki Mori, Tokyo (JP); Digh Hisamoto, Tokyo (JP)

(73) Assignee: HITACHI, LTD., Tokyo (JP)

( * ) Notice: Subject to any disclaimer, the term of this patent is extended or adjusted under 35 U.S.C. 154(b) by 411 days.

(21) Appl. No.: 17/416,604

(22) PCT Filed: Oct. 24, 2019

(86) PCT No.: PCT/JP2019/041743
§ 371 (c)(1),
(2) Date: Jun. 21, 2021

(87) PCT Pub. No.: WO2020/137124
PCT Pub. Date: Jul. 2, 2020

(65) Prior Publication Data
US 2022/0059690 A1    Feb. 24, 2022

(30) Foreign Application Priority Data

Dec. 25, 2018    (JP) .................................. 2018-240505

(51) Int. Cl.
*H01L 29/78*    (2006.01)
*B61C 3/00*    (2006.01)
(Continued)

(52) U.S. Cl.
CPC ............ *H01L 29/7813* (2013.01); *B61C 3/00* (2013.01); *B61C 17/00* (2013.01);
(Continued)

(58) Field of Classification Search
CPC ............. H01L 29/7813; H01L 29/0696; H01L 29/1095; H01L 29/1608; B61C 3/00; B61C 17/00
(Continued)

(56) References Cited

U.S. PATENT DOCUMENTS 5,828,101 A    10/1998  Endo
6,118,149 A    9/2000   Nakagawa et al.
(Continued)

FOREIGN PATENT DOCUMENTS

DE    112015004751 T5    10/2017
EP         0893830 A1     1/1999
(Continued)

OTHER PUBLICATIONS

Search Report mailed Dec. 17, 2019 in International Application No. PCT/JP2019/041743.
(Continued)

*Primary Examiner* — Dzung Tran
(74) *Attorney, Agent, or Firm* — Miles & Stockbridge, P.C.

(57) ABSTRACT

In a SiC power MISFET having a lateral surface of a trench formed in an upper surface of a SiC epitaxial substrate as a channel region, a silicon carbide semiconductor device having low resistance, high performance, and high reliability is realized. As a means therefor, a SiC power MISFET is formed as an island-shaped unit cell on an upper surface of an n-type SiC epitaxial substrate that is provided with a drain region on a bottom surface thereof, the SiC power MISFET including: an n-type current diffusion region that surrounds a p-type body layer contact region and an n-type source region in the indicated order in a plan view; a p-type body layer and an n-type JFET region; a trench that is formed on the body layer so as to span between the source region and
(Continued)

the current diffusion region adjacent each other in a first direction and extends in the first direction; and a gate electrode embedded in the trench with a gate insulating film therebetween.

11 Claims, 18 Drawing Sheets

(51) Int. Cl.
- *B61C 17/00* (2006.01)
- *H01L 29/06* (2006.01)
- *H01L 29/10* (2006.01)
- *H01L 29/16* (2006.01)
- *H02P 27/08* (2006.01)

(52) U.S. Cl.
CPC ...... *H01L 29/0696* (2013.01); *H01L 29/1095* (2013.01); *H01L 29/1608* (2013.01); *H01L 29/7806* (2013.01); *H02P 27/08* (2013.01)

(58) Field of Classification Search
USPC .......................................................... 257/77
See application file for complete search history.

(56) References Cited

U.S. PATENT DOCUMENTS

| | | |
|---|---|---|
| 6,452,231 B1 | 9/2002 | Nakagawa et al. |
| 6,525,375 B1 | 2/2003 | Yamaguchi et al. |
| 7,470,960 B1 | 12/2008 | Sugawara |
| 8,283,721 B2 | 10/2012 | Nakano |
| 8,304,329 B2 | 11/2012 | Zeng |
| 8,354,715 B2 | 1/2013 | Kono et al. |
| 8,658,503 B2 | 2/2014 | Kono et al. |
| 9,117,800 B2 | 8/2015 | Nakano et al. |
| 9,437,592 B2 | 9/2016 | Nakano et al. |
| 9,793,376 B2 | 10/2017 | Miyahara |
| 9,818,860 B2 | 11/2017 | Takeuchi |
| 10,290,704 B2 | 5/2019 | Tega et al. |
| 2003/0001203 A1 | 1/2003 | Ono |
| 2003/0205758 A1 | 11/2003 | Zeng |
| 2004/0021173 A1 | 2/2004 | Sapp |
| 2006/0226439 A1 | 10/2006 | Robb |
| 2008/0135925 A1 | 6/2008 | Takemori |
| 2009/0057711 A1 | 3/2009 | Chen |
| 2010/0327654 A1 | 12/2010 | Azuma |
| 2011/0057202 A1* | 3/2011 | Kono ................ H01L 29/0619 257/E29.198 |
| 2011/0291110 A1* | 12/2011 | Suzuki ................ H01L 29/0878 257/77 |
| 2012/0012861 A1 | 1/2012 | Nakano et al. |
| 2012/0043606 A1* | 2/2012 | Sato .................. H01L 29/66704 257/334 |
| 2012/0319136 A1 | 12/2012 | Noborio et al. |
| 2014/0103364 A1 | 4/2014 | Nakano et al. |
| 2015/0236127 A1* | 8/2015 | Miyahara .............. H01L 21/049 257/77 |
| 2016/0247881 A1 | 8/2016 | Cooper |
| 2016/0344303 A1* | 11/2016 | Nakano ............... H01L 29/7803 |
| 2017/0084735 A1* | 3/2017 | Takeuchi .............. H01L 29/157 |
| 2017/0330961 A1* | 11/2017 | Tega ................. H01L 29/66893 |
| 2018/0331174 A1 | 11/2018 | Tega et al. |

FOREIGN PATENT DOCUMENTS

| | | |
|---|---|---|
| JP | H01273821 A | 11/1989 |
| JP | H08264764 A | 10/1996 |
| JP | H08330601 A | 12/1996 |
| JP | H11103058 A | 4/1999 |
| JP | 2001274398 A | 10/2001 |
| JP | 2002110983 A | 4/2002 |
| JP | 2005-524975 A | 8/2005 |
| JP | 2005524975 A | 8/2005 |
| JP | 2009224811 A | 10/2009 |
| JP | 2009-260253 A | 11/2009 |
| JP | 2009260253 A | 11/2009 |
| JP | 2011060930 A | 3/2011 |
| JP | 2012-043955 A | 3/2012 |
| JP | 2012043955 A | 3/2012 |
| JP | 2012-169386 A | 9/2012 |
| JP | 2012169386 A | 9/2012 |
| JP | 2012-191056 A | 10/2012 |
| JP | 2012191056 A | 10/2012 |
| JP | 2014-003051 A | 1/2014 |
| JP | 2014003051 A | 1/2014 |
| WO | 2010110246 A1 | 9/2010 |
| WO | 2015177914 A1 | 11/2015 |
| WO | 2016116998 A1 | 7/2016 |
| WO | 2016129068 A1 | 8/2016 |

OTHER PUBLICATIONS

Written Opinion mailed Dec. 17, 2019 in International Application No. PCT/JP2019/041743.

Office Action mailed Dec. 30, 2022 in Germany Application No. 11 2019 006470.3.

Notice of Allowance mailed Feb. 25, 2019 in U.S. Appl. No. 15/533,964.

Office Action mailed Oct. 18, 2018 in U.S. Appl. No. 15/533,964.

* cited by examiner

[FIG. 1]
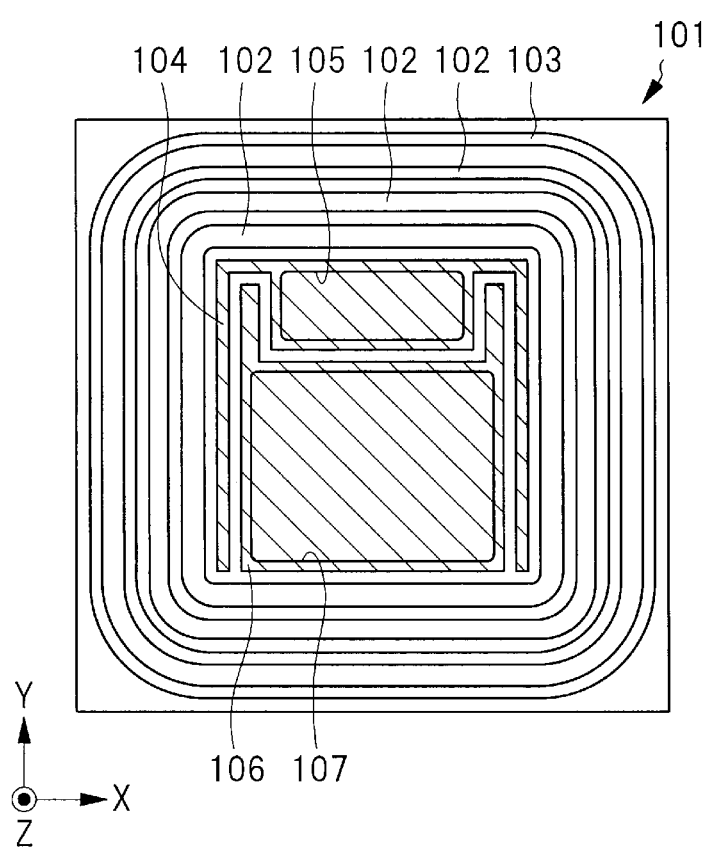

[FIG. 2]
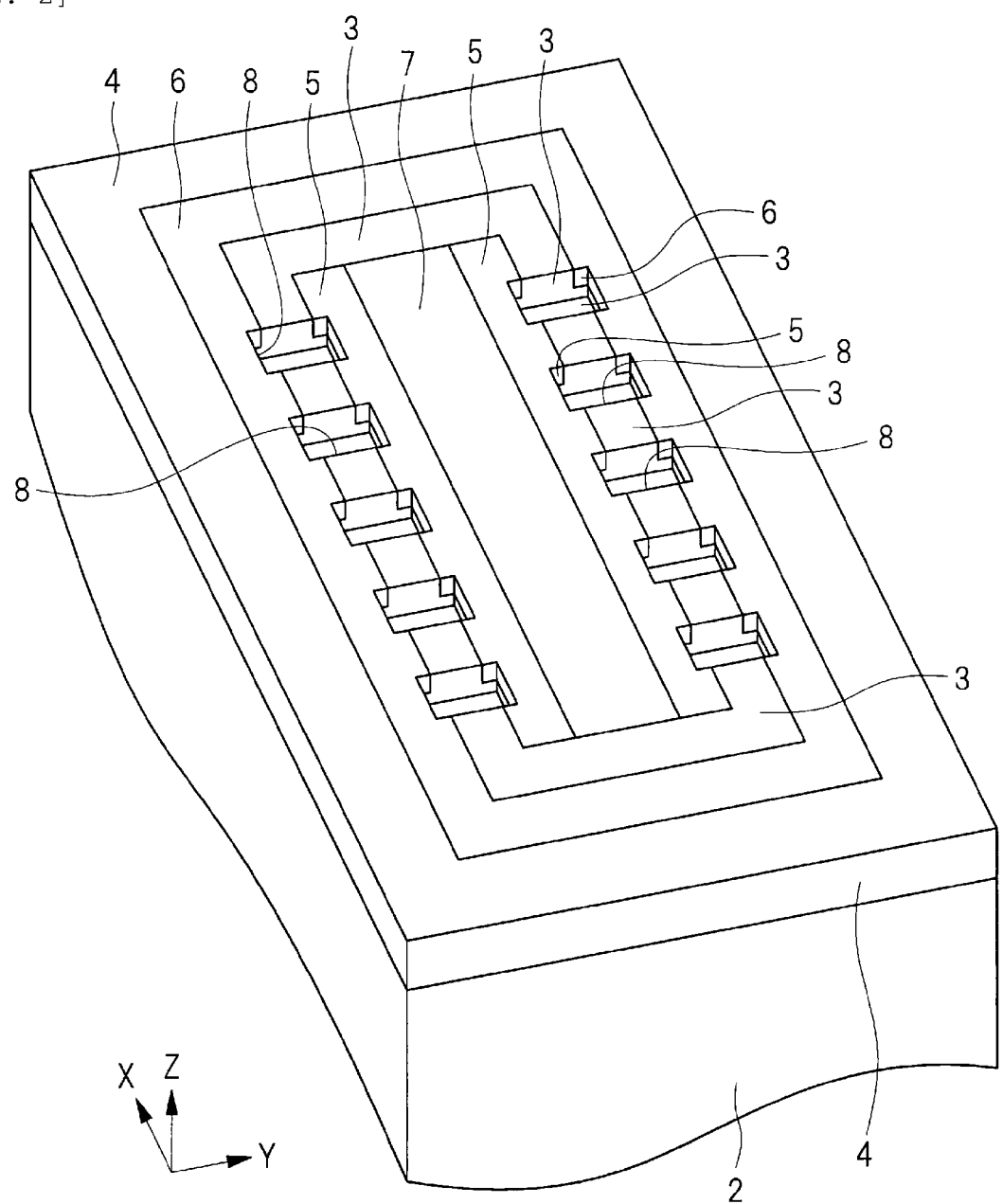

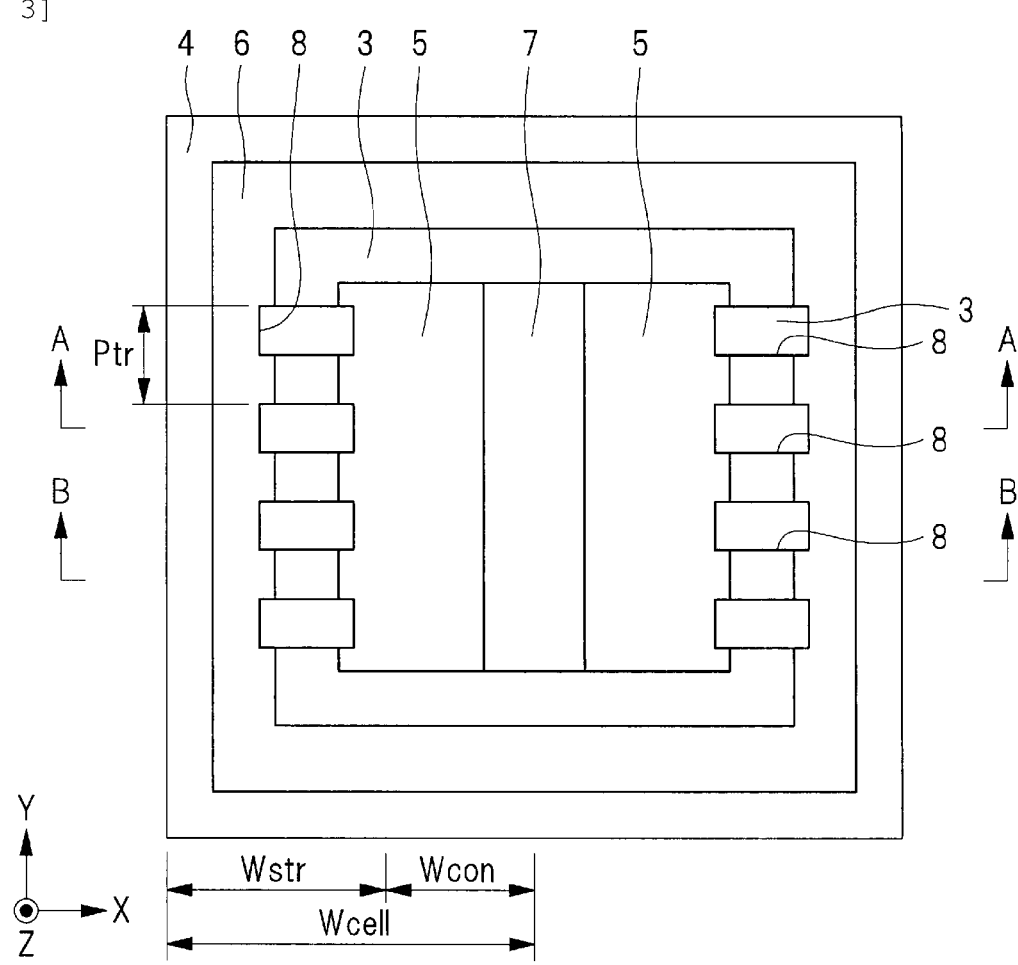
[FIG. 3]

[FIG. 4]
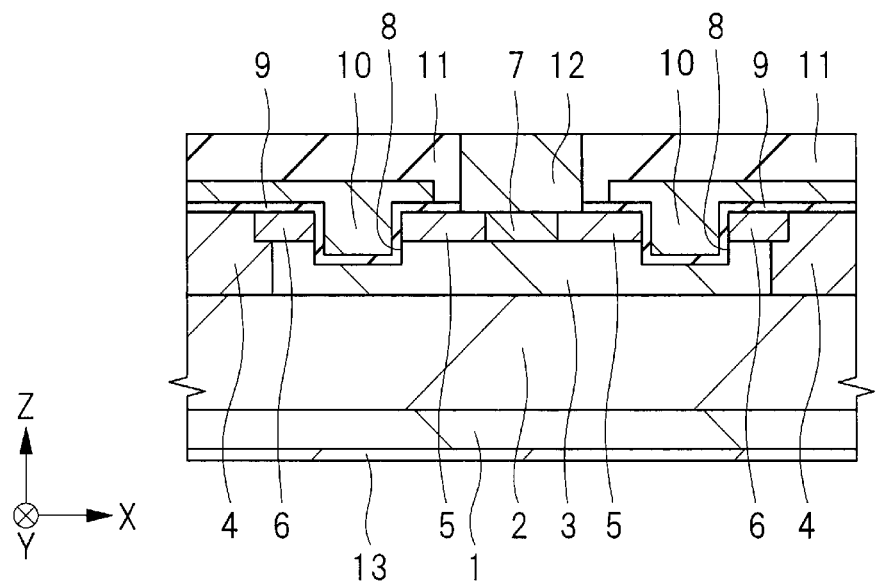
[FIG. 5]
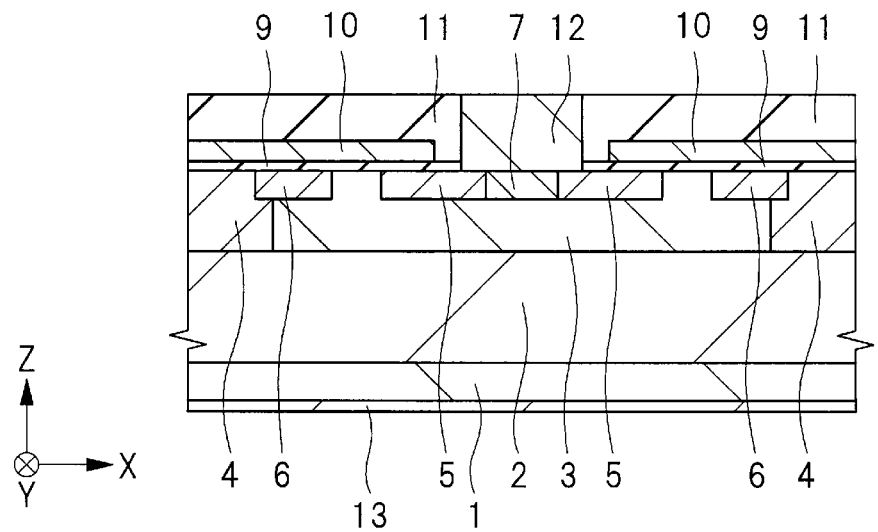

[FIG. 6]
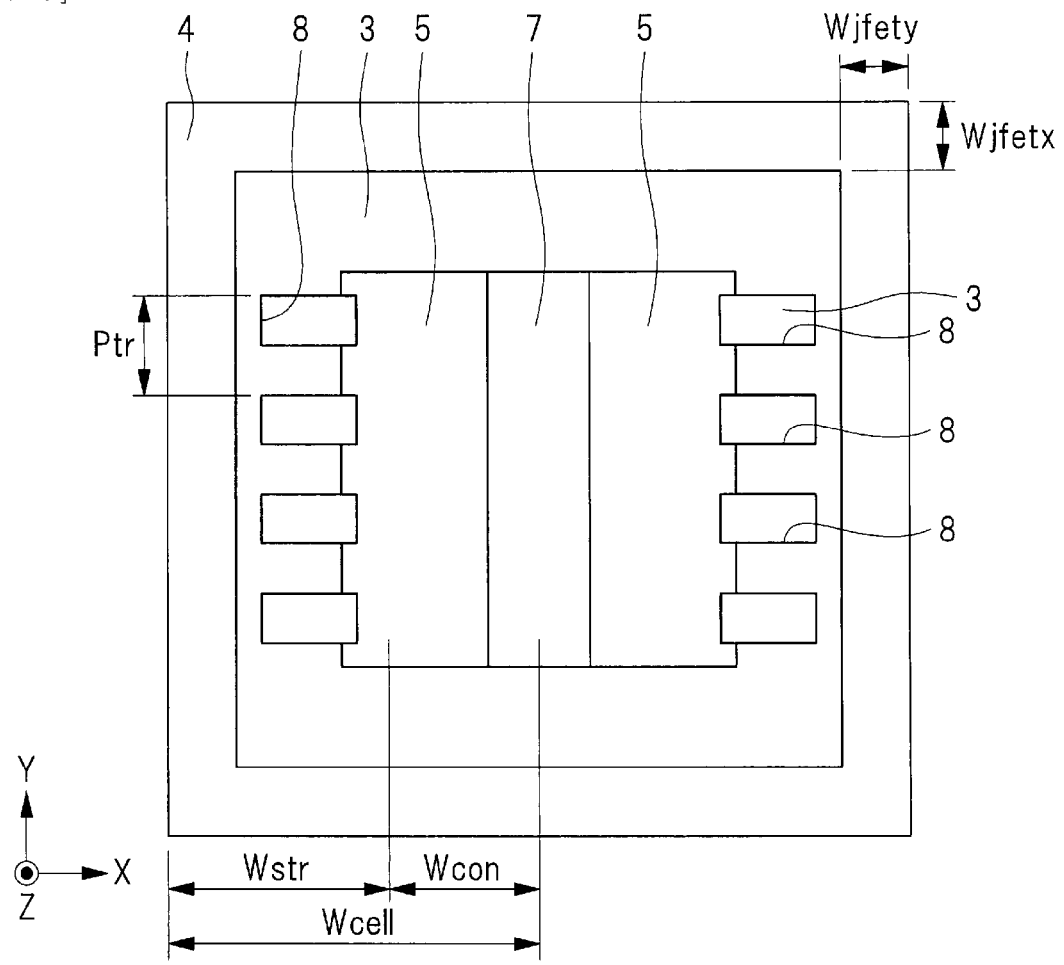

[FIG. 7]
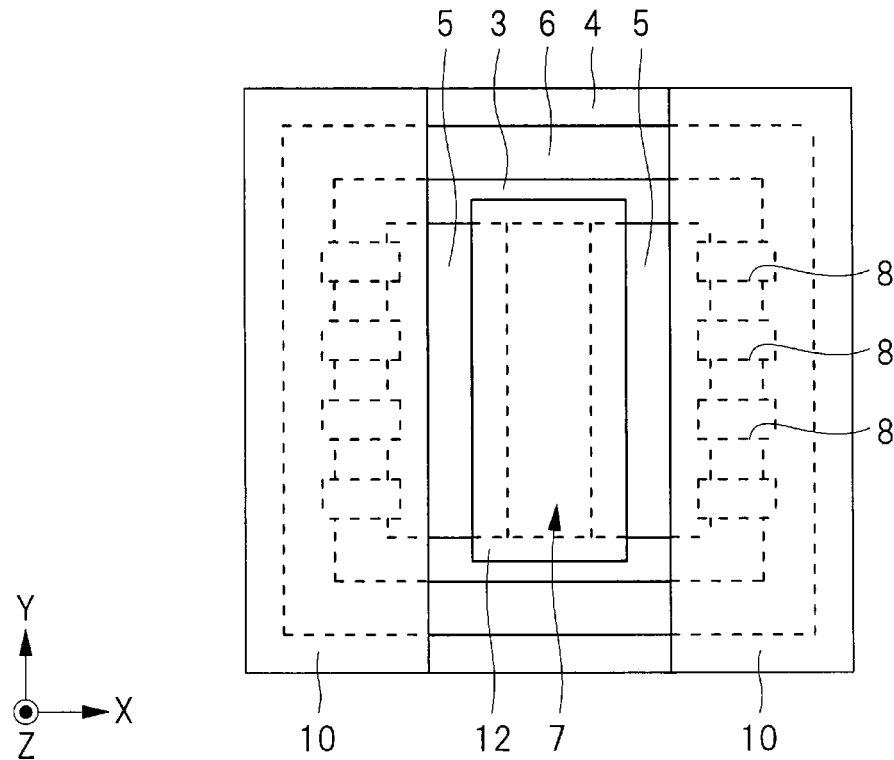
[FIG. 8]
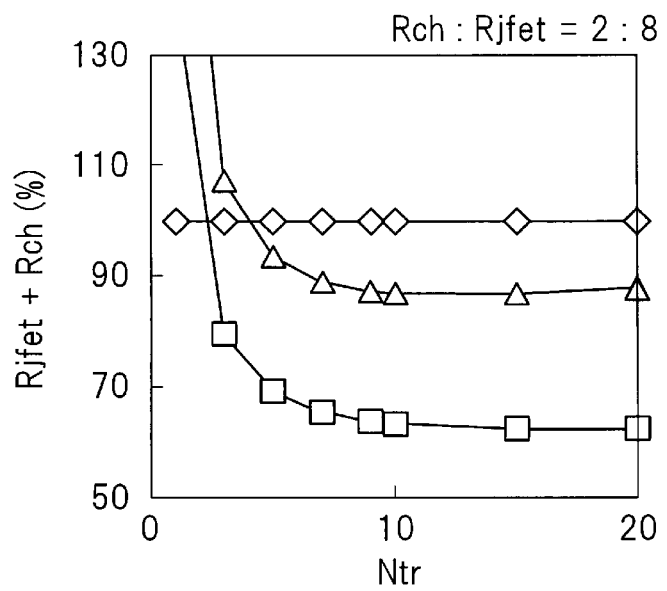

[FIG. 9]
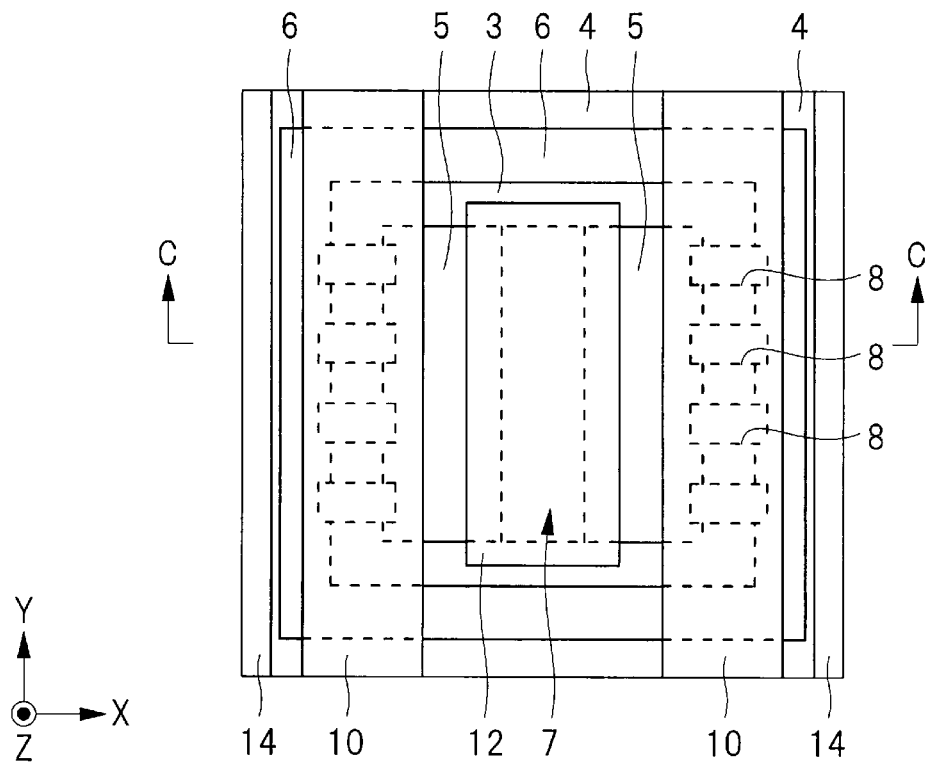
[FIG. 10]
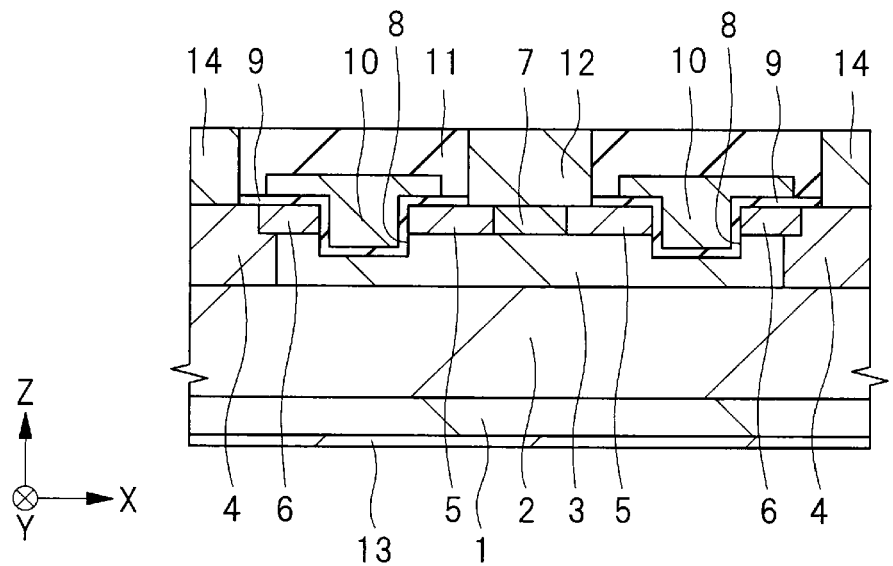

[FIG. 11]
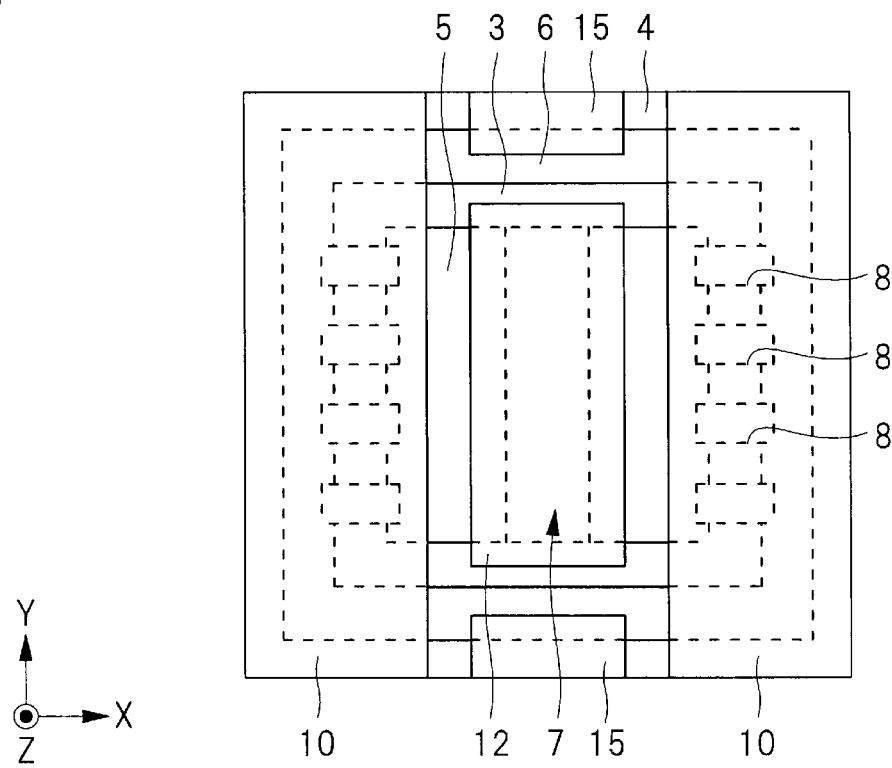
[FIG. 12]
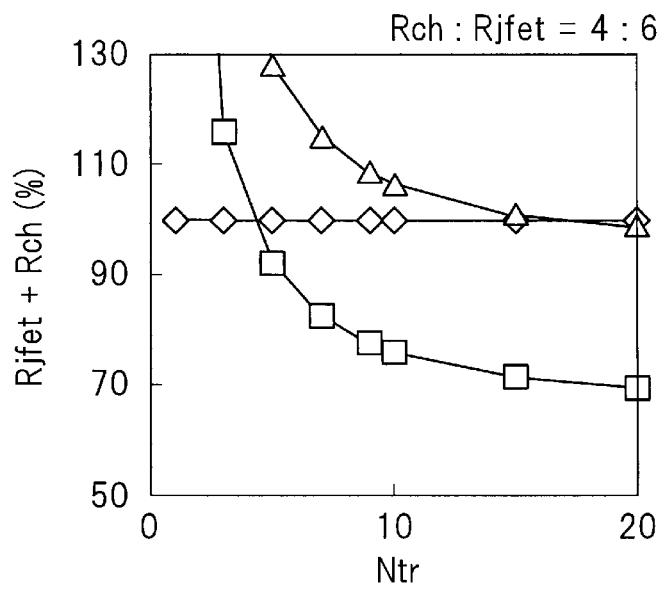

[FIG. 13]
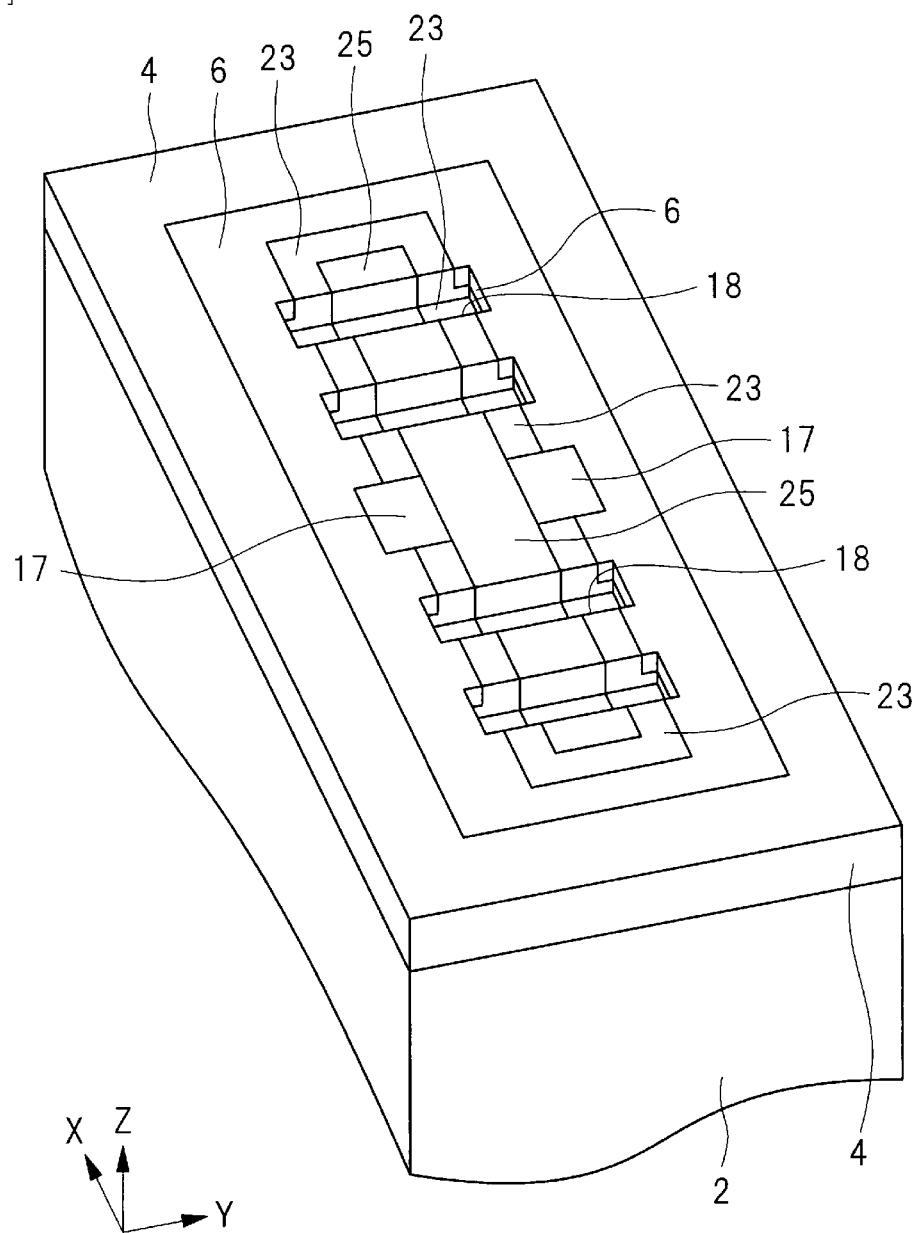

[FIG. 14]
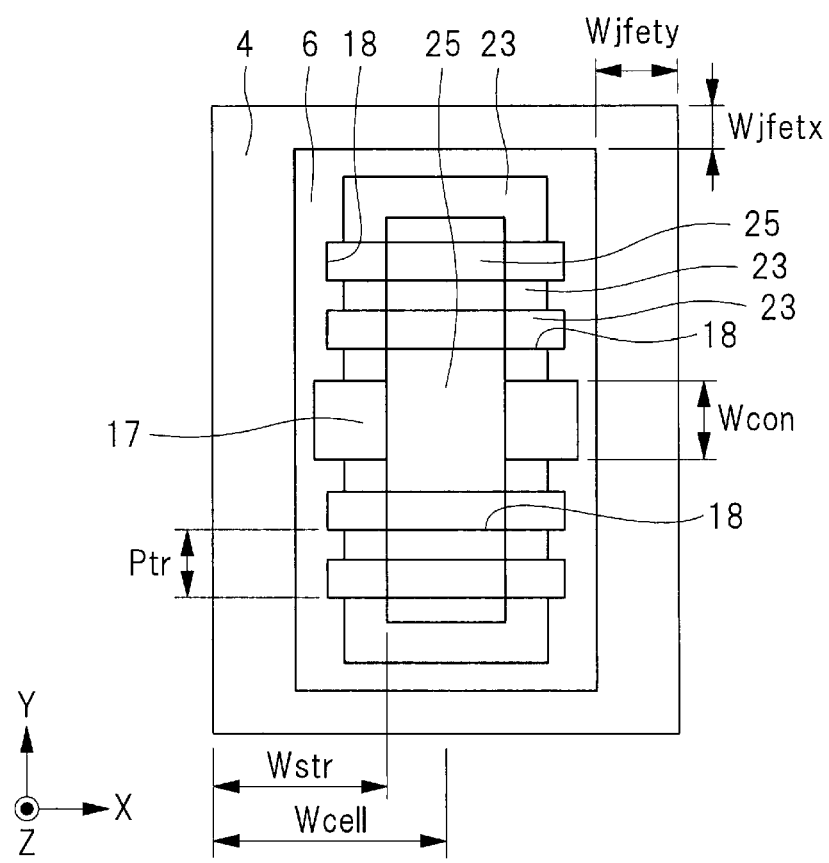

[FIG. 15]
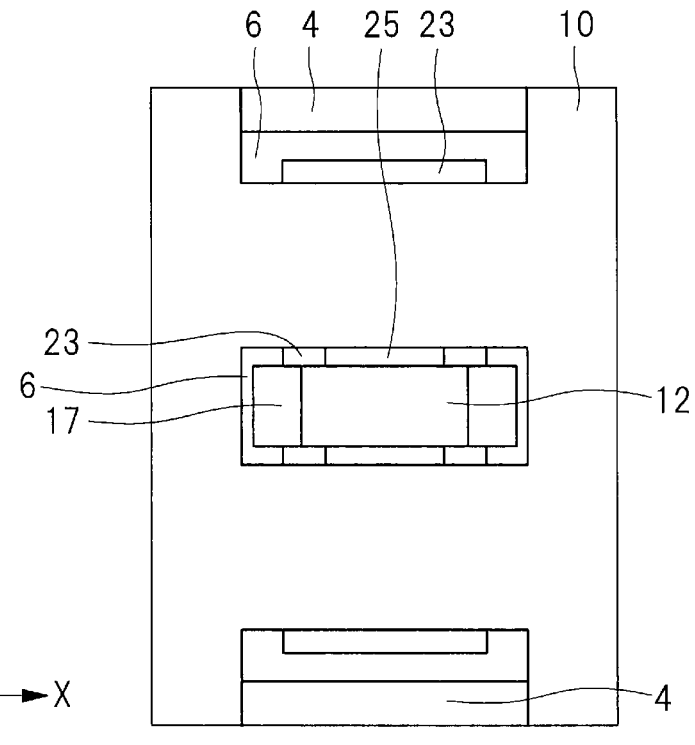
[FIG. 16]
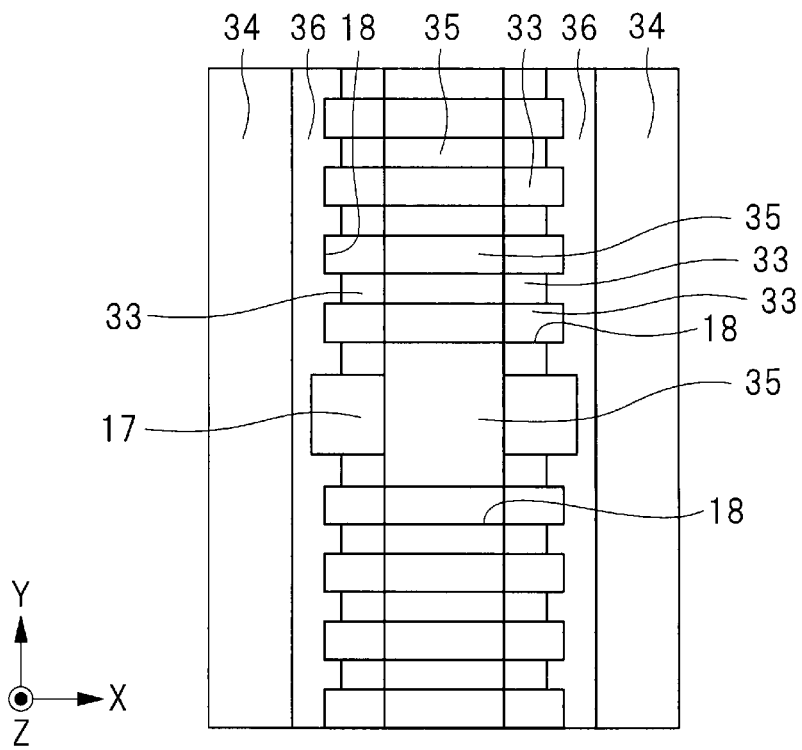

[FIG. 17]
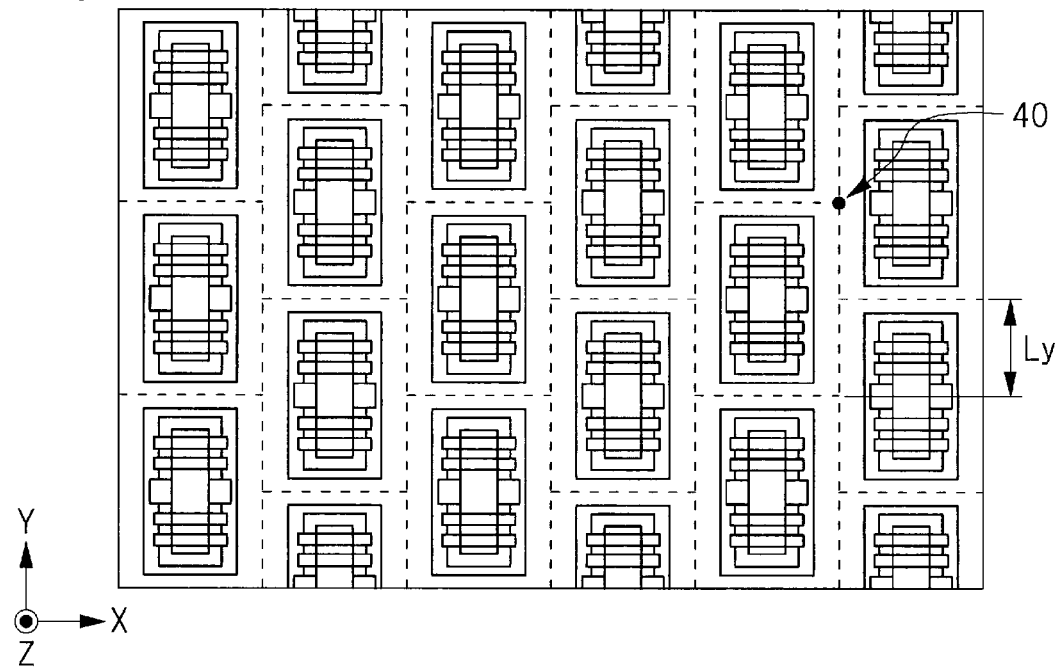
[FIG. 18]
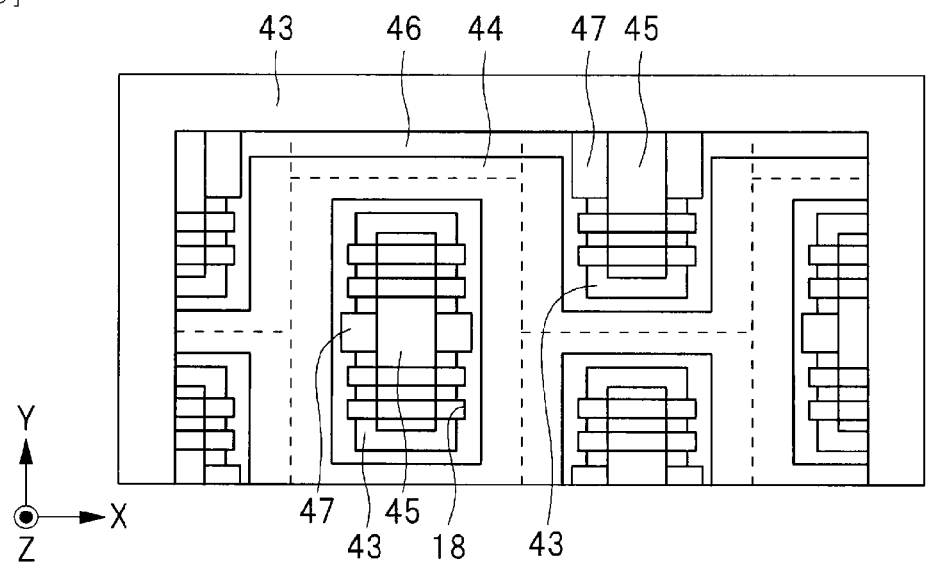

[FIG. 19]
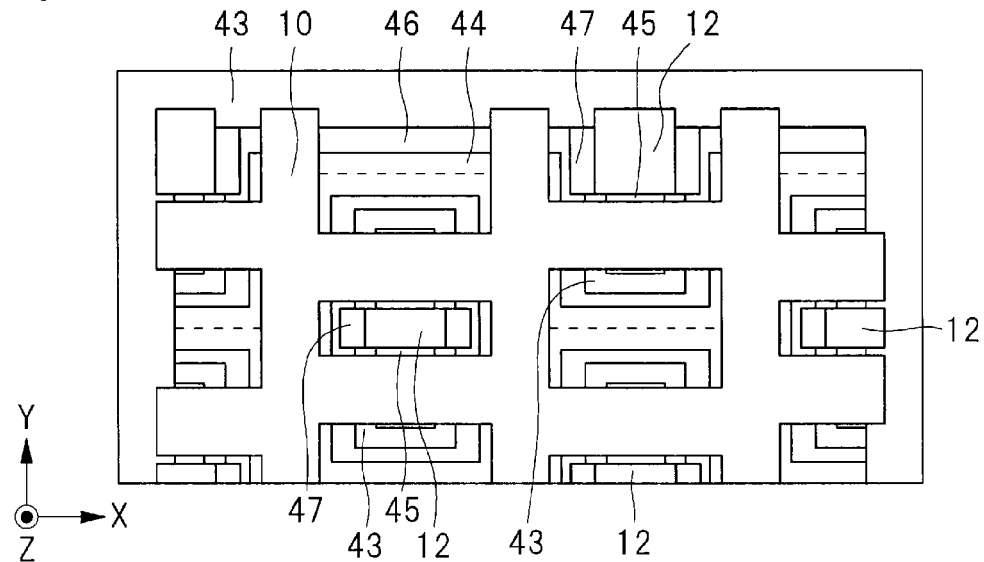
[FIG. 20]
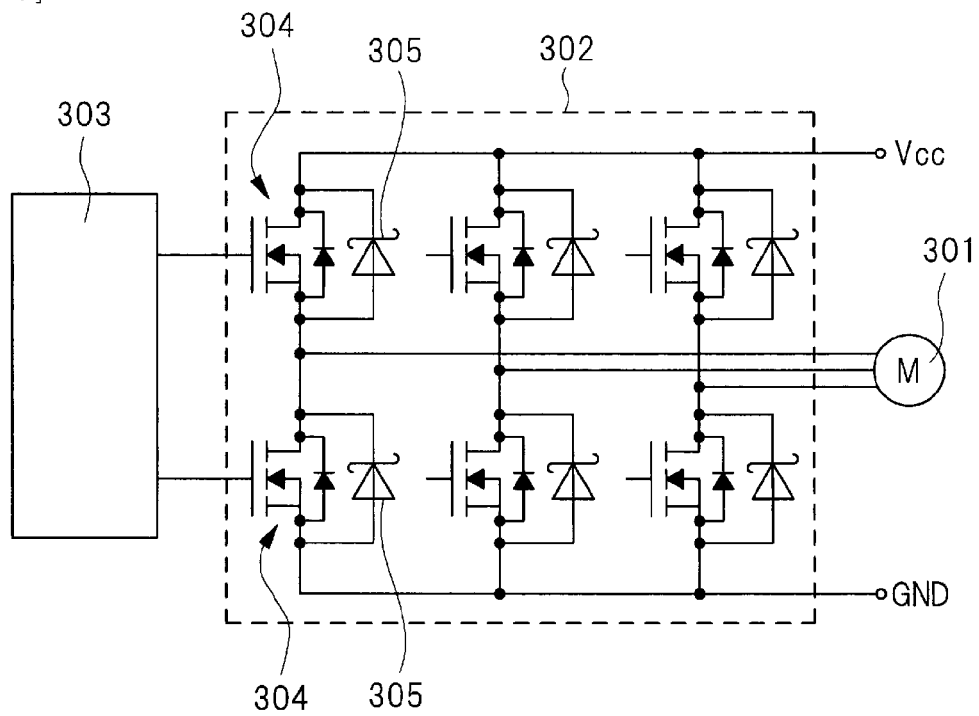

[FIG. 21]
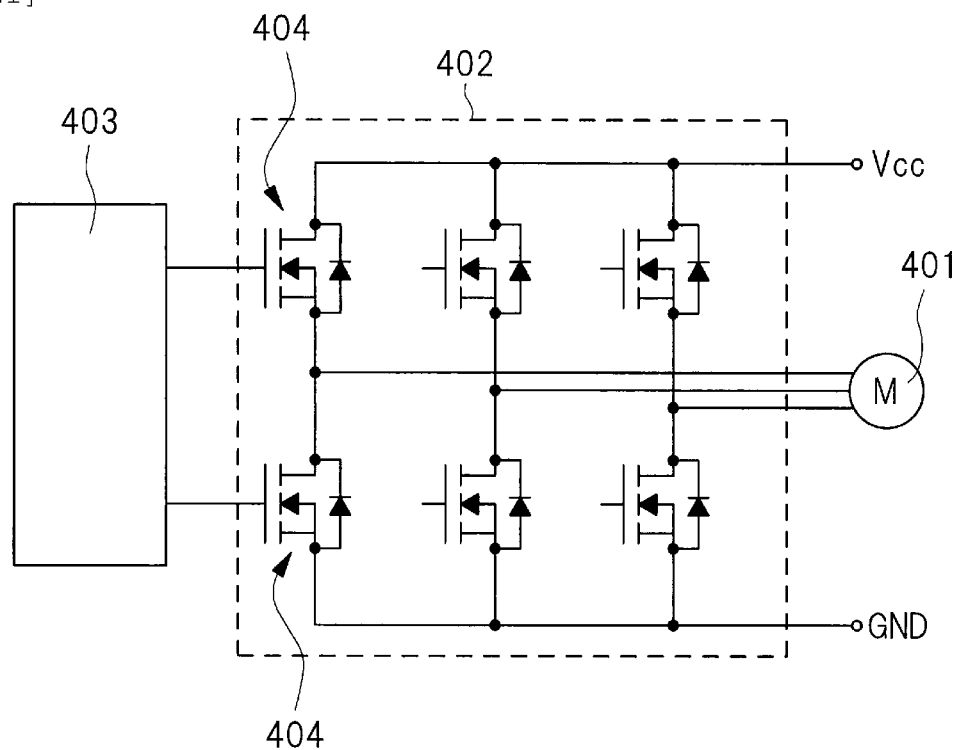
[FIG. 22]
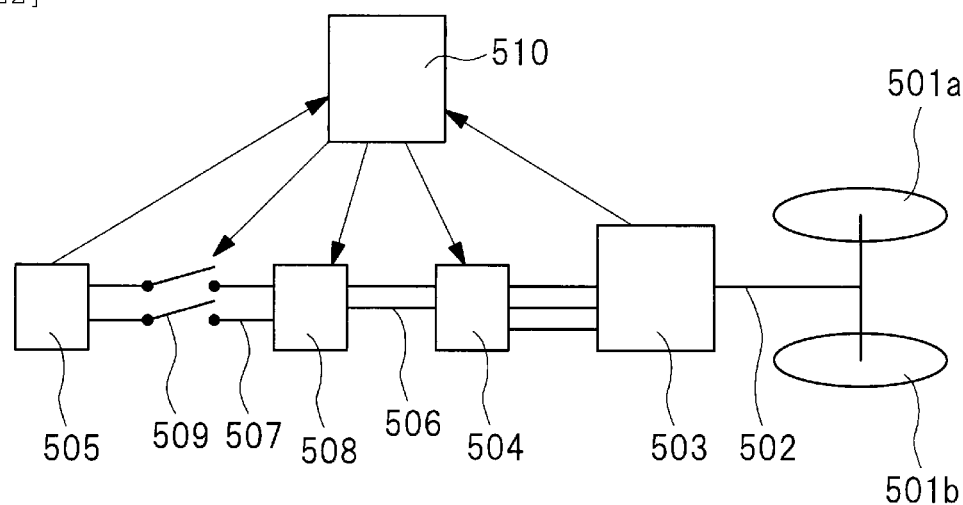

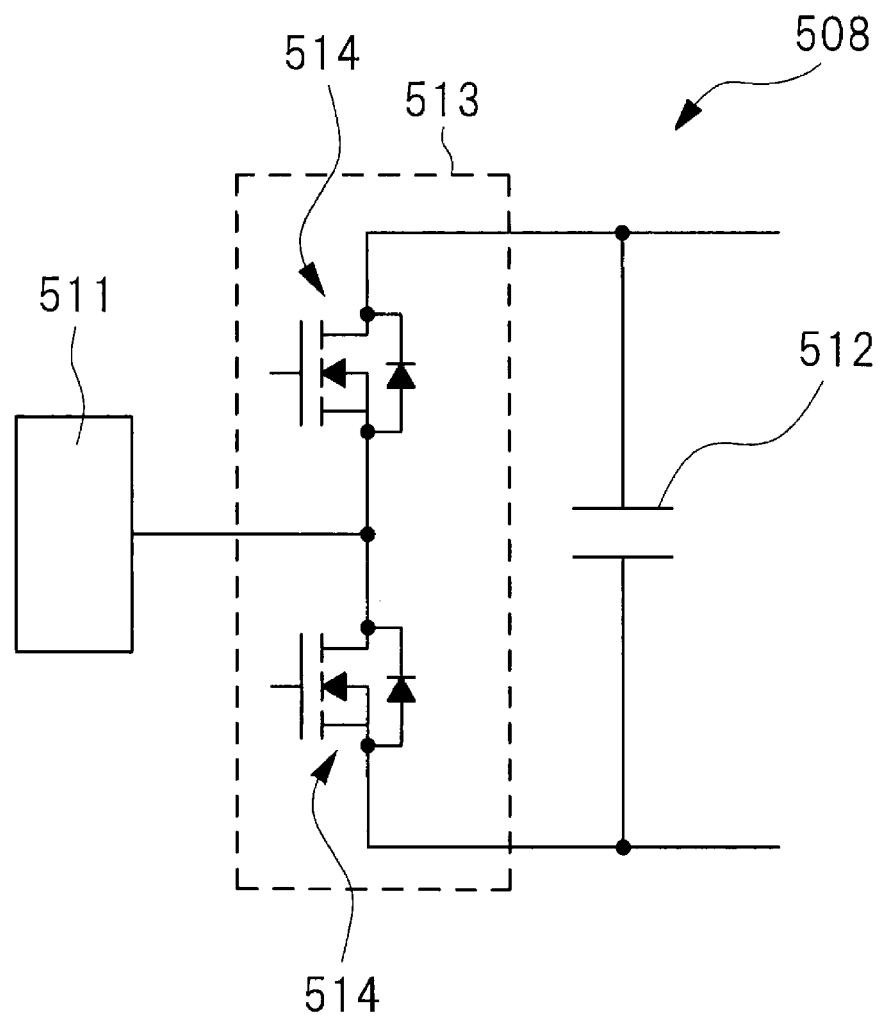
[FIG. 23]

[FIG. 24]
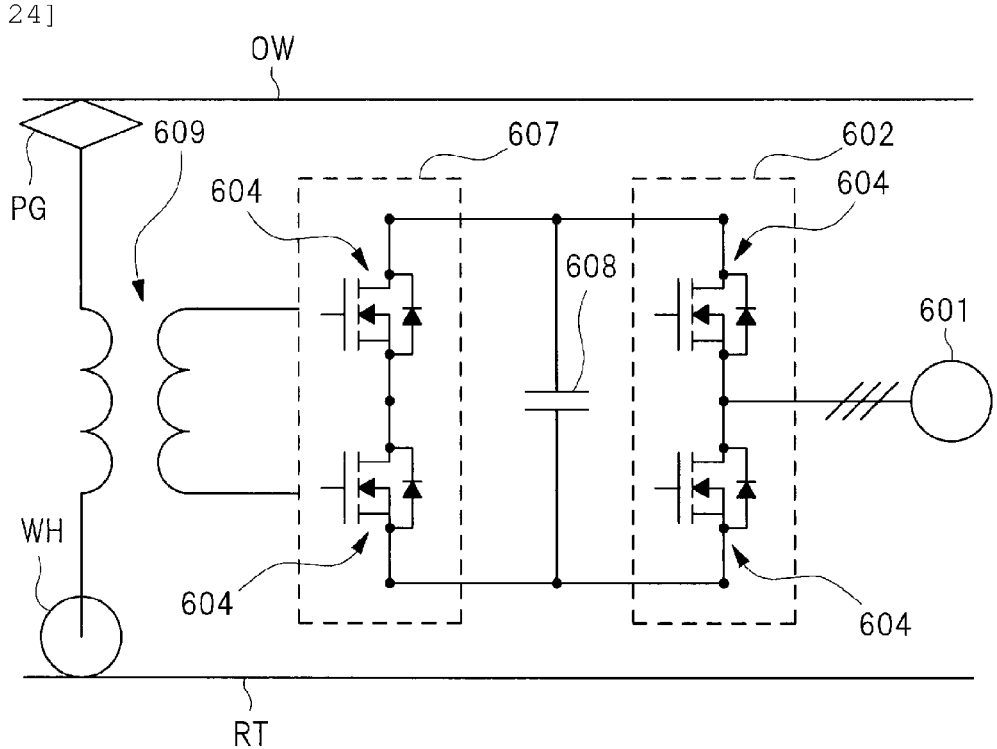

[FIG. 25]
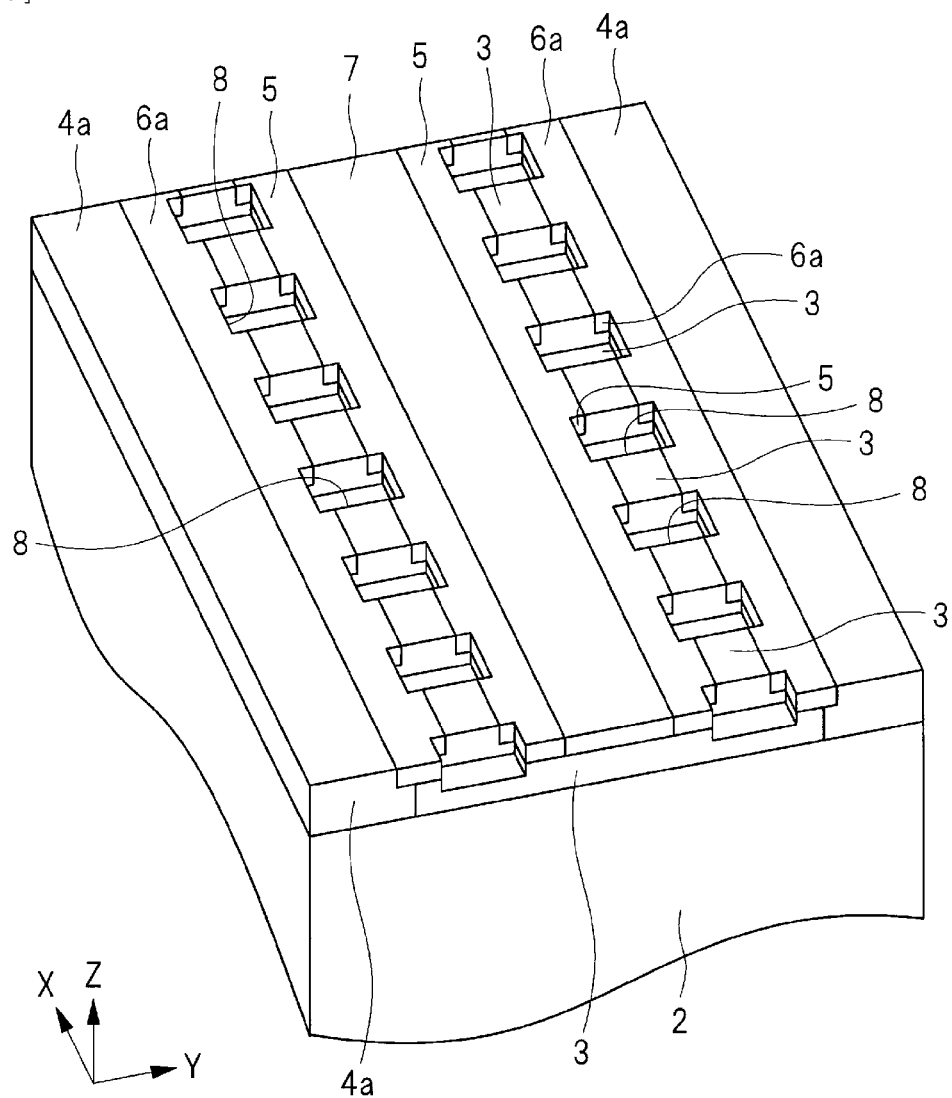

[FIG. 26]
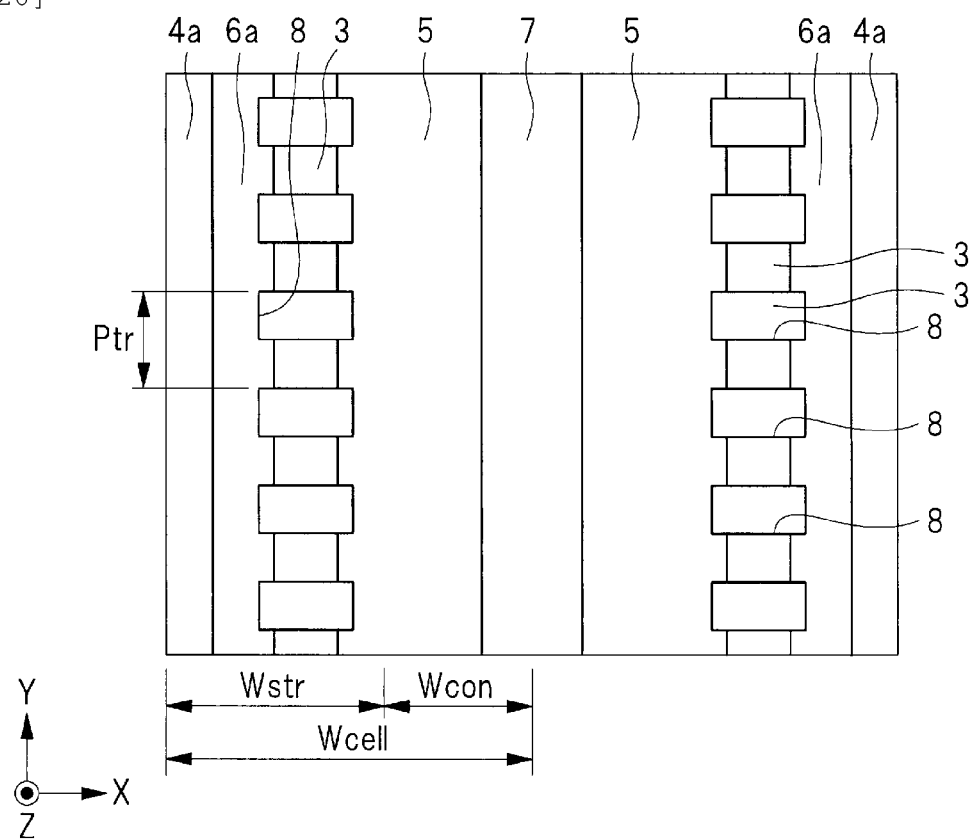

SILICON CARBIDE SEMICONDUCTOR DEVICE, POWER CONVERSION DEVICE, THREE-PHASE MOTOR SYSTEM, AUTOMOBILE, AND RAILWAY VEHICLE

TECHNICAL FIELD

The present invention relates to a silicon carbide semiconductor device, which is a power semiconductor device, particularly having a trench structure, a power conversion device, a three-phase motor system, an automobile, and a railway vehicle.

BACKGROUND ART

In the power metal insulator semiconductor field effect transistor (MISFET), which is one of the power semiconductor devices, in the related art, the power MISFET using a silicon (Si) substrate (hereinafter referred to as Si power MISFET) has been in the mainstream.

However, a power MISFET using a silicon carbide (SiC) substrate (hereinafter referred to as a SiC substrate) (hereinafter referred to as a SiC power MISFET) can have a higher withstand voltage and a lower loss than an Si power MISFET. For this reason, particular attention has been paid to the field of power saving or environment-friendly inverter technology.

The SiC power MISFET can reduce the on-resistance with the same withstand voltage compared with the Si power MISFET. This is because silicon carbide (SiC) has a dielectric breakdown electric field strength of about 7 times as large as that of silicon (Si), and the epitaxial layer serving as a drift layer can be made thinner. However, considering the original characteristics that should be obtained from silicon carbide (SiC), it cannot be said that sufficient characteristics have been obtained yet, and further reduction of on-resistance is desired from the viewpoint of highly efficient use of energy. Further, since the power MISFET using SiC is driven by a larger electric field than the one using Si, the insulating film electric field is also significantly increased and the reliability of the insulating film may be lowered.

In the conventional double diffused metal oxide semiconductor (DMOS) structure, the channel parasitic resistance is relatively high. On the other hand, WO-A-2015/177914 (PTL 1) describes that the (11-20) plane or the (1-100) plane, which is the lateral surface of the trench formed on the upper surface of the substrate of the (0001) plane and has high mobility, is used as a channel to widen the effective channel width. According to this technique, the channel parasitic resistance can be reduced and the on-resistance can be reduced without impairing the reliability of the dielectric breakdown at the bottom of the trench in the OFF state. Hereinafter, this structure is referred to as a trench type DMOS.

Further, WO-A-2016/116998 (PTL 2) discloses that the electric field of the insulating film is significantly reduced and the reliability of the trench type DMOS is increased by forming a shallow impurity region (hereinafter referred to as an electric field relaxation layer) having the same polarity as the body layer on the upper surface of the substrate.

CITATION LIST

Patent Literature

PTL 1: WO-A-2015/177914
PTL 2: WO-A-2016/116998

SUMMARY OF INVENTION

Technical Problem

However, the trench type DMOS of PTLs 1 and 2 has a drawback in that the path length of the JFET region existing in the body layer becomes long and the JFET resistance becomes large.

An object of the present invention is to provide a silicon carbide semiconductor device having a significantly improved performance by adopting a unit cell (periodic structure) of a trench type DMOS capable of reducing JFET resistance and by adopting a cell arrangement suitable for an anisotropic unit cell.

The above and other objects and novel features of the present invention will become apparent from the description and accompanying drawings herein.

Solution to Problem

A brief overview of typical embodiments disclosed in the present application is as follows.

The silicon carbide semiconductor device according to one embodiment increases the peripheral length of the JFET region in the unit cell of the trench type DMOS. Specifically, an island-shaped cell structure is formed by surrounding the unit cell with a current diffusion region in a plan view.

Advantageous Effects of Invention

Among the inventions disclosed in the present application, the effects obtained by representative ones will be briefly described as follows.

According to the present invention, it is possible to provide a high-performance and highly reliable silicon carbide semiconductor device. As a result, it is possible to realize the high performance of power conversion devices, three-phase motor systems, automobiles, and railway vehicles.

BRIEF DESCRIPTION OF DRAWINGS

FIG. 1 is a plan view showing a silicon carbide semiconductor device according to Embodiment 1 of the present invention.

FIG. 2 is a bird's-eye view showing the silicon carbide semiconductor device according to Embodiment 1 of the present invention.

FIG. 3 is a plan view showing the silicon carbide semiconductor device according to Embodiment 1 of the present invention.

FIG. 4 is a cross-sectional view taken along the line A-A of FIG. 3.

FIG. 5 is a cross-sectional view taken along the line B-B of FIG. 3.

FIG. 6 is a plan view showing a part of the silicon carbide semiconductor device according to Embodiment 1 of the present invention transmitted through.

FIG. 7 is a plan view showing the silicon carbide semiconductor device according to Embodiment 1 of the present invention.

FIG. 8 is a graph showing the relationship between the number of trenches and a resistance reduction rate when the ratio of the channel resistance to the JFET resistance is 2:8.

FIG. 9 is a plan view showing the silicon carbide semiconductor device according to Modification 1 of Embodiment 1 of the present invention.

FIG. 10 is a cross-sectional view taken along the line C-C of FIG. 9.

FIG. 11 is a plan view showing a silicon carbide semiconductor device according to Modification 2 of Embodiment 1 of the present invention.

FIG. 12 is a graph showing the relationship between the number of trenches and a resistance reduction rate when the ratio of the channel resistance to the JFET resistance is 4:6.

FIG. 13 is a bird's-eye view showing a silicon carbide semiconductor device according to Embodiment 2 of the present invention.

FIG. 14 is a plan view showing the silicon carbide semiconductor device according to Embodiment 2 of the present invention.

FIG. 15 is a plan view showing the silicon carbide semiconductor device according to Embodiment 2 of the present invention.

FIG. 16 is a plan view showing a silicon carbide semiconductor device according to Embodiment 3 of the present invention.

FIG. 17 is a plan view showing a terminal portion of an active region of a silicon carbide semiconductor device according to Embodiment 4 of the present invention.

FIG. 18 is a plan view showing a terminal portion of the active region of the silicon carbide semiconductor device according to Embodiment 4 of the present invention.

FIG. 19 is a plan view showing a terminal portion of the active region of the silicon carbide semiconductor device according to Embodiment 4 of the present invention.

FIG. 20 is a circuit diagram showing a power conversion device according to Embodiment 5 of the present invention.

FIG. 21 is a circuit diagram showing a power conversion device according to Embodiment 6 of the present invention.

FIG. 22 is a schematic diagram showing the configuration of an electric vehicle according to Embodiment 7 of the present invention.

FIG. 23 is a circuit diagram showing a boost converter according to Embodiment 7 of the present invention.

FIG. 24 is a circuit diagram showing a converter and an inverter in a railway vehicle according to Embodiment 8 of the present invention.

FIG. 25 is a bird's-eye view showing a silicon carbide semiconductor device according to a comparative example.

FIG. 26 is a plan view showing the silicon carbide semiconductor device according to the comparative example.

DESCRIPTION OF EMBODIMENTS

Hereinafter, embodiments of the present invention will be described in detail with reference to the drawings. In all the drawings for illustrating the embodiments, the members having the same function are designated by the same reference numerals and the repeated description thereof will be omitted. Further, in the following embodiments, the description of the same or similar portions is not repeated in principle unless it is particularly necessary. Further, in the drawings for illustrating the embodiments, hatching may be added even in a plan view or a perspective view in order to make the configuration easy to understand. Further, in the drawings for illustrating the embodiments, hatching may be omitted in the cross-sectional view in order to make the configuration easy to understand.

Further, in the drawings used in the following description, the electric field relaxation layer described in PTL 2 is omitted, but the structure can be similarly applied to the structure shown in the present embodiment. In that case, an electric field relaxation layer is formed on the JFET region and the current diffusion region adjacent to the substrate surface.

Further, "−" and "+" are codes indicating the relative impurity concentrations of the n-type or p-type conductive type, and, for example, the impurity concentration of the n-type impurity increases in the order of "$n^{--}$", "$n^{-}$", "n", "$n^{+}$", and "$n^{++}$".

<Details of Room for Improvement>

The details of the room for improvement will be described below with reference to FIGS. 25 and 26. FIG. 25 is a bird's-eye view showing a silicon carbide semiconductor device according to a comparative example. FIG. 26 is a plan view showing the silicon carbide semiconductor device according to the comparative example.

As shown in FIG. 25, the SiC power metal insulator semiconductor field effect transistor (MISFET), which is a trench type double diffused metal oxide semiconductor (DMOS) of the comparative example, has a striped periodic structure (unit cell). An $n^{-}$ type epitaxial layer (semiconductor layer) 2 made of silicon carbide (SiC) having a lower impurity concentration than the $n^{+}$ type SiC substrate is formed on the upper surface (first main surface) of an $n^{+}$ type SiC substrate (not shown) made of silicon carbide (SiC). The epitaxial layer 2 functions as a drift layer. The thickness of the epitaxial layer 2 is, for example, about 5 to 50 μm.

A p-type body layer (well region) 3 having a predetermined depth from the upper surface of the epitaxial layer 2 is formed in the epitaxial layer 2, and the body layer 3 is electrically connected to a source electrode via a $p^{++}$ type body layer contact region 7 formed in a central portion of the upper surface of the body layer 3. Further, an $n^{++}$ type source region 5 having a predetermined depth from the surface of the epitaxial layer 2 and containing nitrogen as an impurity is formed in the body layer 3 and is electrically formed with the source electrode. The arrangement relationship between the body layer contact region 7 and the source region 5 is not limited to the line pattern shown in FIG. 25. That is, in FIG. 25, the body layer contact region 7 extends in the Y direction. However, for example, a plurality of separated body layer contact regions 7 may be arranged side by side in the Y direction, and the source regions 5 may be arranged between the plurality of body layer contact regions 7.

A JFET region 4a having a predetermined depth from the upper surface of the epitaxial layer 2 is formed in the epitaxial layers 2 at both ends of the unit cell of the SiC power MISFET shown in FIG. 25 in the X direction. The JFET region 4a is an n-type semiconductor region between the body layers 3 of the unit cells adjacent to each other in the X direction. The n-type impurity concentration in the JFET region 4a may be the same as the n-type impurity concentration in the epitaxial layer 2 but may be higher than the n-type impurity concentration in the epitaxial layer 2. An $n^{+}$ type current diffusion region 6a having a predetermined depth from the upper surface of the epitaxial layer 2 is formed between the body layer 3 and the JFET region 4a. The JFET region 4a and the current diffusion region 6a are formed as a line pattern extending only in the Y direction in the comparative example.

In this way, one unit cell is arranged in the order from the end of the unit cell in the X direction toward the central portion of the unit cell in the X direction and includes the JFET region 4a, the current diffusion region 6a, the body layer 3, the source region 5, and the body layer contact region 7, which extend in the Y direction, respectively. Further, one unit cell has a plane layout that is line-symmetrical in the X direction with the body layer contact region 7 as the center in the X direction, and the body layer 3 is formed below each of the current diffusion region 6a, the source region 5, and the body layer contact region 7.

Further, as a component of the unit cell, a plurality of trenches 8 extending from the n$^{++}$ type source region 5 across the p-type body layer 3 so as to span over the n$^{+}$ type current diffusion region 6a are formed to be arranged in the Y direction. That is, among the lateral surfaces of the trench 8, the source region 5 is formed on one of the two lateral surfaces facing each other in the X direction, the current diffusion region 6a is formed on the other one, and the body layer 3 is formed on the other lateral surfaces (the two lateral surfaces facing each other in the Y direction). The bottom surface of the trench 8 is in contact with the p-type body layer 3. A gate electrode (not shown) is formed on the trench 8 with a gate insulating film (not shown) therebetween. When the gate electrode is on, the electrons flowing through the SiC power MISFET pass from the n$^{++}$ type source region 5 through the p-type body layer 3 on the lateral surface of the trench 8, which is the channel region adjacent to the gate electrode, and moves to the n-type JFET region 4a, the n$^{-}$ type epitaxial layer 2, the n$^{+}$ type SiC substrate that is the drain region, and the drain wiring electrode (not shown) at the bottom of the SiC substrate in the indicated order.

FIG. 26 shows a plan view of a unit cell having a striped structure of the silicon carbide semiconductor device according to the comparative example. Each unit cell is connected to another unit cell adjacent by a unit cell boundary, which is the outer circumference of the layout shown in FIG. 26.

As shown in FIG. 26, all of the plurality of unit cells formed on the semiconductor chip of the comparative example have a striped structure composed of a plurality of semiconductor regions extending in the Y direction. That is, in the active region (element forming region) of the semiconductor chip of the comparative example, a plurality of unit cells shown in FIG. 26 are arranged side by side in the X direction. This is because the trench type DMOS uses the (11-20) plane or the (1-100) plane with high carrier mobility as a channel. That is, the lateral surface of the trench 8 in which the body layer 3 (channel region) between the source region 5 and the current diffusion region 6a is formed needs to be a surface along the X direction.

As described above, since the trench type DMOS is an element whose characteristics greatly differ depending on the plane orientation of the channel, forming an element having a plane other than the (11-20) plane and the (1-100) plane as the channel causes unexpected operation of the silicon carbide semiconductor device and fluctuations in the timing at which the SiC power MISFET is turned on. Therefore, in order to align the channel directions in the X direction, all the JFET regions 4a and the n$^{+}$ type current diffusion region 6a extend in the Y direction orthogonal to the X direction, which is the extending direction of the channel forming surface. The layout of the unit cells may be longer in the Y direction than the structure shown in FIG. 26.

The length Ptr shown in FIG. 26 is the cell pitch in the Y direction, that is, the period of a plurality of trenches arranged in the Y direction. The cell pitch in the X direction is twice the sum of the contact width Wcon determined in the wiring process and the actual structure width Wstr determined by the device parameters. The actual structure width Wstr is composed of a JFET width, a channel length, and an insulating film thickness, which determine the performance of the silicon carbide semiconductor device, and an overlapping margin between masks that determines the yield of the silicon carbide semiconductor device.

The cell area is Ptr×2×(Wstr+Wcon), and one JFET region having a length Ptr and two trenches 8 are present therein. Therefore, the channel density (JFET number density) Djfet and the trench density Dtr are represented by the following Equations 1 and 2, respectively.

$$Djfet=1/(2\times(Wstr+Wcon))[L^{-1}] \quad \text{(Equation 1)}$$

$$Dtr=1/(Ptr\times(Wstr+Wcon))[L^{-2}] \quad \text{(Equation 2)}$$

In Equations 1 and 2, L is the dimension of length. The JFET resistance is inversely proportional to the channel density Djfet. The channel resistance is inversely proportional to the trench density Dtr.

As is clear from the order of the dimensions, when the actual structure width Wstr or the contact width Wcon becomes smaller due to the scaling (reduction) of the cell pitch, the channel resistance, which is inversely proportional to the trench density Dtr whose dimension is to the second power, decreases sharply, but the JFET resistance, which is inversely proportional to the channel density Djfet whose dimension is to the first power, is difficult to decrease. The trench density Dtr can be easily increased by shortening the opening length Ptr in the mask for forming the trench 8. Further, since the channel mobility of the trench type DMOS is several times larger than that of the flat type DMOS having no trench, the channel resistance can be easily reduced in the trench type DMOS, and the channel resistance can be reduced to almost 0. On the other hand, since the channel density Djfet is rate-determined by the actual structure width Wstr determined by the device parameters, the JFET resistance cannot be reduced and remains at high resistance.

That is, the trench type DMOS of the comparative example has a problem that the path length of the JFET region 4a becomes long and the JFET resistance becomes large. Since the JFET region 4a has a higher current density than the drift region, a large JFET resistance becomes a big problem especially in a device driven by a large current. Although the JFET resistance can be reduced by employing a design having a wide JFET width, there is a limit to the increase in the JFET width because the cell pitch in the X direction increases and the withstand voltage decreases.

As described above, reducing the JFET resistance in the silicon carbide semiconductor device provided with the trench type DMOS exists as room for improvement.

Therefore, in the embodiments of the present application, a device is devised to solve the above-mentioned room for improvement. In the following, the technical idea in the embodiments in which the present device is applied will be described.

Embodiment 1

Hereinafter, a SiC power MISFET having a lateral surface in a trench (groove, recess) as a channel region, that is, a trench type DMOS will be taken as an example and a silicon carbide semiconductor device will be described with reference to the drawings.

<Structure of Silicon Carbide Semiconductor Device>

The structure of the silicon carbide semiconductor device according to Embodiment 1 will be described with reference to FIGS. 1 to 7. FIG. 1 is a plan view of a semiconductor chip on which a silicon carbide semiconductor device of the present embodiment composed of a plurality of SiC power MISFETs is mounted. FIG. 2 is a bird's-eye view showing the silicon carbide semiconductor device of the present embodiment. FIGS. 3 and 7 are plan views showing the silicon carbide semiconductor device of the present embodiment. FIGS. 4 and 5 are cross-sectional views showing the silicon carbide semiconductor device of the present embodiment. Specifically, FIG. 4 is a cross-sectional view taken along the line A-A of FIG. 3, which is a cross-sectional view including a trench and a gate electrode in the trench. FIG. 5 is a cross-sectional view taken along the line B-B of FIG. 3, which is a cross-sectional view of a portion not including a trench. FIG. 6 is a plan view showing a part of the silicon carbide semiconductor device of the present embodiment transmitted through. In FIGS. 2, 3, and 6, the structure on the epitaxial layer, that is, the gate insulating film, the gate electrode, the interlayer insulating film, the source plug, and the like shown in FIG. 4 are not shown. In FIG. 7, the interlayer insulating film shown in FIG. 4 is not shown.

As shown in FIG. 1, a semiconductor chip 101 on which the silicon carbide semiconductor device is mounted includes an n-type silicon carbide (SiC) epitaxial substrate (hereinafter referred to as a SiC epitaxial substrate), and a gate wiring electrode 104, and a source wiring electrode 106 are formed side by side on the SiC epitaxial substrate. In FIG. 1, in order to make the drawing easier to understand, the gate wiring electrode 104 and the source wiring electrode 106 are hatched. The semiconductor chip 101 is composed of an active region (SiC power MISFET forming region, element forming region) located below the source wiring electrode 106, and a peripheral forming region surrounding the active region in a plan view. A plurality of n-channel type SiC power MISFETs formed in the active region are connected in parallel to the source wiring electrode 106. The peripheral forming region includes a plurality of floating field limiting rings (FLR) 102 formed so as to surround the active region in a plan view, and a guard ring 103 formed so as to surround the plurality of floating field limiting rings 102 in a plan view.

A gate electrode of the SiC power MISFET, an $n^{++}$ type source region, a channel region, and the like are formed on the upper surface side of the active region of the SiC epitaxial substrate, and an $n^+$ type drain region of the SiC power MISFET is formed on the back surface side of the SiC epitaxial substrate. Each of the plurality of floating field limiting rings 102 is composed of a p-type semiconductor region formed at a predetermined depth from the upper surface of the SiC epitaxial substrate. The guard ring 103 is composed of an n-type semiconductor region formed at a predetermined depth from the upper surface of the SiC epitaxial substrate.

By forming a plurality of p-type floating field limiting rings 102 around the active region, the maximum electric field portion sequentially moves to the outer floating field limiting ring 102 when the SiC power MISFET is turned off and yields at the outermost floating field limiting ring 102. Thereby, the withstand voltage of the silicon carbide semiconductor device can be increased. FIG. 1 shows an example in which three floating field limiting rings 102 are formed, but the present invention is not limited thereto. Further, the $n^{++}$ type guard ring 103 has the function of protecting the SiC power MISFET formed in the active region.

The plurality of SiC power MISFETs formed in the active region have an island-like pattern in a plan view. That is, the plurality of SiC power MISFETs constitute a plurality of unit cells (periodic structure), and each of the unit cells has an island-shaped planar layout and is arranged so as to be separated from each other. The gate electrode (not shown) of the island-shaped SiC power MISFET is electrically connected to the gate wiring electrode 104 by a lead wiring (gate bus line) existing on the outer peripheral portion of the semiconductor chip 101.

Further, the plurality of SiC power MISFETs are covered with the source wiring electrodes 106, and the source region of each SiC power MISFET and the potential fixing layer of the body layer are connected to the source wiring electrode 106. The source wiring electrode 106 is connected to an external wiring (not shown) through a source opening 107 provided in the insulating film. The gate wiring electrode 104 is formed so as to be separated from the source wiring electrode 106 and is connected to each gate electrode of the plurality of SiC power MISFETs. The gate wiring electrode 104 is connected to an external wiring (not shown) through a gate opening 105. The external wiring referred to here is wiring (for example, a bonding wire) for electrically connecting the semiconductor chip 101 and an external device of the semiconductor chip 101. Further, the $n^+$ type drain region formed on the back surface side of the n-type SiC epitaxial substrate is electrically connected to the drain wiring electrode (not shown) formed so as to cover the entire back surface of the n-type SiC epitaxial substrate.

Next, the structure of the unit cell of the SiC power MISFET, which is the silicon carbide semiconductor device of the present embodiment, will be described with reference to FIGS. 2 to 5. The XYZ coordinate axes used in the description are defined in the directions shown in the drawing. In the present application, the X direction (X-axis direction) and the Z direction (Z-axis direction) are directions along the (11-20) plane and the (1-100) plane of the crystal planes of the SiC substrate, respectively, and the Y direction (Y-axis direction) is a direction perpendicular to each of the (11-20) plane and the (1-100) plane. Each of the X direction and the Y direction is a direction along the upper surface (main surface) of the SiC epitaxial substrate, and the Z direction is the thickness direction (height direction, depth direction) of the SiC epitaxial substrate. The X direction, the Y direction, and the Z direction are orthogonal to each other.

As shown in FIGS. 4 and 5, the SiC epitaxial substrate constituting the silicon carbide semiconductor device includes the $n^+$ type SiC substrate 1 and the $n^-$ type epitaxial layer (semiconductor layer) 2 formed on the $n^+$ type SiC substrate 1. The epitaxial layer 2 functions as a drift layer. The thickness of the epitaxial layer 2 is, for example, about 5 to 50 μm.

As shown in FIGS. 2 to 5, the body layer (well region) 3, which is a p-type semiconductor region, is formed in the epitaxial layer 2 to have a predetermined depth from the upper surface of the epitaxial layer 2. The body layer contact region 7, which is a p type semiconductor region, and the source region 5, which is an $n^{++}$ type semiconductor region containing nitrogen as an impurity, are formed in the body layer 3 to have a predetermined depth from the surface of the epitaxial layer 2. In a plan view, the body layer contact region 7 extending in the Y direction is formed in the central portion of the epitaxial layer 2, a pair of source regions 5 adjacent to the body layer contact region 7 are formed so as to sandwich the body layer contact region 7 in the X direction, and the body layer 3 is formed so as to surround the body layer contact region 7 and the source regions 5. The body layer contact region 7 and the source regions 5 are connected to the source wiring electrode 106 (see FIG. 1) formed on the epitaxial layer 2 via a source plug (source conductive connection portion, source electrode) 12. That is, the body layer 3 is electrically connected to the source wiring electrode 106 via the body layer contact region 7 and the source plug 12.

In other words, the body layer 3 is formed in the epitaxial layer 2 from the upper surface of the epitaxial layer 2 to the intermediate depth of the epitaxial layer 2, and the source region 5, a current diffusion region 6, and the body layer contact region 7 are respectively formed from the upper surface of the body layer 3 to the intermediate depth of the body layer 3. Further, a JFET region 4 is formed from the upper surface of the epitaxial layer 2 to the intermediate depth of the epitaxial layer 2.

In a plan view, the JFET region 4 is formed in the epitaxial layer 2 around the body layer 3 constituting the unit cell to have a predetermined depth from the upper surface of the epitaxial layer 2. That is, the JFET region 4 is in contact with the epitaxial layer 2. The JFET region 4 is an n-type semiconductor region between the body layers 3 of adjacent unit cells in a plan view. The n-type impurity concentration in the JFET region 4 may be the same as the n-type impurity concentration in the epitaxial layer 2 but may be higher than the n-type impurity concentration in the epitaxial layer 2. The current diffusion region 6, which is an $n^+$ type semiconductor region having a predetermined depth from the upper surface of the epitaxial layer 2, is formed between the body layer 3 and the JFET region 4. The current diffusion region 6 is formed from the upper surface of the body layer 3 to the intermediate depth of the body layer 3, and in a plan view, the current diffusion region 6 is formed in an annular shape to surround the body layer contact region 7, the source region 5, and the body layer 3. Among the ends of the current diffusion region 6, the end opposite to the source region 5 does not overlap with the body layer 3 in a plan view and is formed in the epitaxial layer 2 adjacent to the body layer 3.

Each of the current diffusion region 6 and the JFET region 4 is composed of a rectangular annular pattern including a pattern extending in the Y direction and a pattern extending in the X direction. Further, since the body layer 3 is formed between the source region 5 and the body layer contact region 7, and the current diffusion region 6 on the upper surface of the epitaxial layer 2, the body layer 3 is composed of a rectangular annular pattern including a pattern extending in the Y direction and a pattern extending in the X direction in a plan view.

One unit cell has a plane layout that is line-symmetrical in the X direction with the body layer contact region 7 as the center in the X direction. The body layer contact region 7 and the source region 5 are in contact with each other. Further, the source region 5 and the body layer 3 are in contact with each other, and the current diffusion region 6 and the body layer 3 are in contact with each other. The current diffusion region 6 and the JFET region 4 are in contact with each other.

As described above, one unit cell of the SiC power MISFET includes the body layer contact region 7, the source regions 5 sandwiching the body layer contact region 7 in the X direction, and the current diffusion region 6 and the JFET region 4 which have an annular shape and surround the body layer contact region 7 and the source region 5 in the indicated order, and the body layer 3.

Further, as a component of the unit cell, a plurality of trenches 8 extending from the $n^{++}$ type source region 5 across the p-type body layer 3 so as to span over the $n^+$ type current diffusion region 6 are formed side by side in the Y direction. That is, among the lateral surfaces of the trench 8, the source region 5 is in contact with one of the two lateral surfaces facing each other in the X direction, the current diffusion region 6 is in contact with the other side, and the body layer 3 between the source region 5 and the current diffusion region 6 is in contact with the other lateral surfaces (the lateral surfaces facing each other in the Y direction). The trench 8 is formed deeper than both the source region 5 and the current diffusion region 6 and is formed shallower than the body layer 3. Therefore, the bottom surface of the trench 8 is in contact with the p-type body layer 3 and does not reach the epitaxial layer 2 below the body layer 3. The source region 5 and the body layer 3 are in contact with each other on the lateral surface extending in the X direction among the lateral surfaces of the trench 8, and the current diffusion region 6 and the body layer 3 are in contact with each other on the lateral surfaces extending in the X direction among the lateral surfaces of the trench 8. The body layer contact region 7 is in contact with the body layer 3 at both ends in the Y direction.

The current diffusion region 6, the body layer contact region 7, and the source region 5 are separated from each other in a plan view. The current diffusion region 6 is composed of a Y-axis line (first portion) which extends in the Y direction and is in contact with the trench 8 and the JFET region 4, and an X-axis line (second portion) which extends in the X direction and is separated from the trench 8 and in contact with the JFET region 4. In one unit cell, the two Y-axis lines and the two X-axis lines of the current diffusion region 6 form an annular pattern.

The trench 8 is formed so as to overlap only the pattern extending in the Y direction (Y-axis line) of the body layer 3 in a plan view and does not overlap the pattern extending in the X direction (X-axis line) in the plan view. In other words, the trench 8 is formed between the source region 5 and the current diffusion region 6 adjacent in the X direction, but the trench 8 is not formed between the source region 5 and the current diffusion region 6 adjacent in the Y direction. This is because, in the trench type DMOS, the trench can not be extended only in a specific direction due to the plane orientation anisotropy of the electronic physical characteristics of SiC. That is, as described above, forming an element having a plane other than the (11-20) plane and the (1-100) plane as a channel causes an unexpected operation of the silicon carbide semiconductor device and fluctuations in the timing at which the SiC power MISFET is turned on. Therefore, in order to align the directions of the channels in the X direction, all the trenches 8 are formed between the source region 5 and the current diffusion region 6 adjacent to each other in the X direction so that the channels are formed on the (11-20) plane or the (1-100) plane, which is the lateral surface along the X direction.

As shown in FIG. 4, the back surface (bottom surface) of the SiC substrate 1 is covered with a drain wiring electrode (drain electrode) 13. That is, the drain wiring electrode 13 is electrically connected to the SiC substrate 1. A gate electrode 10 is formed on the epitaxial layer 2 including the surface of the trench 8 via a gate insulating film 9. When the gate electrode 10 is on, electrons flowing through the SiC power MISFET pass from the $n^{++}$ type source region 5 through the p-type body layer 3 on the lateral surface of the trench 8 that is a channel region adjacent to the gate electrode 10 and move to the n-type JFET region 4, the $n^-$ type epitaxial layer 2, the $n^+$ type SiC substrate that is the drain region, and the drain wiring electrode 13 at the bottom of the SiC substrate in the indicated order. The gate insulating film 9 is made of, for example, a silicon oxide film, and the gate electrode 10 is made of, for example, a polysilicon film (conductor film).

The current diffusion region 6 has a role to prevent the current from being concentrated to flow in a part of the region due to the electrons that have passed through the body layer 3 flowing downward in the JFET region 4 and heading toward the SiC substrate 1 side at the shortest distance. That is, since the current diffusion region 6 having a relatively high impurity concentration is formed, the electrons that have passed through the body layer 3 are diffused in the current diffusion region 6 and flows uniformly in the n-type semiconductor region including the current diffusion region 6 and the JFET region 4.

An interlayer insulating film 11 made of, for example, a silicon oxide film is formed on each of the epitaxial layer 2, the gate insulating film 9, and the gate electrode 10. The laminated film composed of the gate insulating film 9 and the interlayer insulating film 11 includes a through hole at a position separated from the gate electrode 10, and the source plug 12, which is a conductive connection portion, is formed in the through hole. The source plug 12 is electrically connected to the body layer contact region 7 and the source region 5. The source plug 12, and the body layer contact region 7, and the source region 5 may be directly connected to each other or may be connected to each other via another metal film or silicide layer. The source plug 12 is electrically connected to the source wiring electrode 106 (see FIG. 1). Further, the gate electrode 10 is electrically connected to the gate wiring electrode 104 (see FIG. 1).

In the SiC power MISFET having an island structure according to the present embodiment, the laminated structure of each semiconductor region (impurity region) in the Z direction is the same as the striped structure of the comparative example, but the arrangement in the XY plane is different. In the present embodiment, the striped structure is arranged for a certain period at the central portion of the unit cell in the Y direction, and at the end of the unit cell in the Y direction, the impurity regions in the order of the body layer 3 surrounding the body layer contact region 7 and the source region 5, the current diffusion region 6, and the JFET region 4 are terminated. In this structure, the four sides around the unit cell are the JFET region 4. A configuration in which a plurality of island-shaped unit cells are arranged in the element region will be described later in Embodiment 4.

Next, FIG. 6 shows a plan view of the silicon carbide semiconductor device of the present embodiment in which the current diffusion region 6 (see FIG. 3) is not shown. As shown in FIGS. 3 and 4, the body layer 3 and the current diffusion region 6 may have an overlap having a certain width in each line in the X direction and the Y direction in a plan view, and the width of each overlap may be different from each other. Further, a JFET width Wjfetx in the lateral direction (Y direction) of the X-direction pattern (X-axis line) of the JFET region 4 and a JFET width Wjfety in the lateral direction (X direction) of the Y-direction pattern (Y-axis line) of the JFET region 4 may also have different values from each other. The X-axis line of the JFET region 4 refers to a pattern extending in the X direction in the annular JFET region 4, and the Y-axis line of the JFET region 4 refers to a pattern extending in the Y direction of the annular JFET region 4. Each of the JFET width Wjfetx and the JFET width Wjfety is assumed to be defined by a magnitude of ½ of the distance between the respective body layers 3 of the two adjacent unit cells in the X or Y direction.

Next, FIG. 7 shows a plan view of the silicon carbide semiconductor device of the present embodiment. FIG. 7 shows an example of the arrangement of the source electrode and the gate electrode. The source electrode referred to here corresponds to the source plug 12 shown in FIGS. 4 and 5. In FIG. 7, the outlines of the semiconductor region and the trench formed on the upper surface of the epitaxial layer in the portion covered by the source plug 12 and the gate electrode 10 are shown by broken lines.

Although the gate insulating film 9 (see FIG. 4) is not shown in FIG. 7, the gate insulating film 9 is formed directly below the gate electrode 10. As shown in FIG. 7, the gate insulating film 9 and the gate electrode 10 extend in the Y direction on each of all the trenches 8, the body layer 3 extending in the Y direction in a plan view, the current diffusion region 6, and the JFET region 4, and is connected to the gate insulating film 9 and the gate electrode 10 of the adjacent unit cell. The gate electrode 10 is connected by all the cells existing in the Y direction as in the striped structure of the comparative example and is connected to the gate wiring electrode 104 (see FIG. 1). A part of each of the gate insulating film 9 and the gate electrode 10 covering the trench 8 may be formed on the JFET region 4 extending in the X direction.

The source electrode (source plug 12) is terminated inside the outer end of the annular body layer 3 in a plan view. However, when the electric field relaxation layer described in PTL 2 is formed on the current diffusion region 6, the source electrode may be present as long as the source electrode is on the region where the electric field relaxation layer exists. Even if there is no electric field relaxation layer on the JFET region 4 extending in the X direction, if the JFET structure is properly designed and the contact between the source electrode and the JFET region 4 is a Schottky junction, the source electrode may exist on the JFET region 4.

Here, the source electrode is formed so as to cover the entire body layer contact region 7 and the source region 5 adjacent to the body layer contact region 7 in the X direction, and the end of the source electrode in the Y direction overlaps the body layer 3 extending in the X direction in a plan view. However, the source electrode may be formed separately in the unit cell. Further, regarding the junction between the source electrode and the epitaxial layer 2 (see FIG. 4) in the unit cell, when the ohmic contact and the Schottky junction are mixed, it is necessary to divide the process of forming the source electrode into two. In either design, proper insulation is required to prevent contact between the gate electrode and the source electrode.

When the source electrode is arranged so as to form a Schottky junction between the JFET region 4 and a part of the source electrodes, the source electrode and the JFET region 4 operate as a Schottky barrier diode, and thus, it is possible to reduce the deterioration of energization during bipolar operation of the elements constituting a silicon carbide semiconductor device.

That is, in the SiC power MISFET, when a basal plane dislocation (BPD) is formed in the epitaxial layer on the SiC substrate and electrons and holes recombine in the region where the BPD is formed, the energy released by the recombination causes the crystals in the epitaxial layer to shift. As a result, surface defects called Shockley type stacking faults spread in the epitaxial layer. Since such stacking faults hinder the movement of electrons flowing in the longitudinal direction in the epitaxial layer (drift layer), in the SiC power MISFET in which the stacking faults have spread, the element resistance (substrate resistance) and the forward voltage (on voltage) increase. These stacking faults continue to expand due to the flow of electrons and holes into the SiC epitaxial substrate when the SiC power MISFET is operated, and thus, the resistance between the source and drain and the resistance of the built-in diode increase with the passage of energization time. That is, problems are generated that the characteristics of the SiC power MISFET change due to the deterioration of energization, and the performance and reliability of the silicon carbide semiconductor device deteriorate.

Such a phenomenon particularly occurs when a current flows through the built-in diode (pn diode) formed between the p-type body layer contact region 7 and the body layer 3 shown in FIG. 4, and the n-type epitaxial layer 2 and the SiC substrate 1. The built-in diode can operate when the SiC power MISFET is turned off and the energy stored in the inductance is discharged as a recirculation current (during reverse operation). If a Schottky barrier diode composed of the source electrode and the JFET region 4 is formed as described above, the recirculation current flows through the Schottky barrier diode in preference to the built-in diode, and thus, it is possible to prevent the occurrence of the above-mentioned deterioration of energization due to the current flowing through the built-in diode.

The depth (first depth) from the upper surface of the epitaxial layer 2 of the p-type body layer 3 shown in FIGS. 2 to 5 is, for example, about 0.5 to 2.0 μm. The depth (third depth) of the n$^{++}$ type source region 5 from the upper surface of the epitaxial layer 2 is, for example, about 0.1 to 1 μm. The depth (fourth depth) of the n$^+$ type current diffusion region 6 from the upper surface of the epitaxial layer 2 is, for example, about 0.1 to 1 μm. The width at which the p-type body layer 3 and the n$^+$ type current diffusion region 6 do not overlap in a plan view is, for example, about 0.1 to 2 μm. The depth (sixth depth) of the trench 8 from the upper surface of the epitaxial layer 2 is shallower than the depth (first depth) of the p-type body layer 3 from the upper surface of the epitaxial layer 2, and is, for example, about 0.1 to 1.5 μm. The length of the trench 8 in the direction parallel to the channel length (X direction) is, for example, about 0.5 to 3 μm. The length of the trench 8 in the direction parallel to the channel width (Y direction) is, for example, about 0.1 to 2 μm. The distance between the trenches in the direction parallel to the channel width of the trench 8 (Y direction) is, for example, about 0.1 to 2 μm. The depth (second depth) of the p type body layer contact region 7 from the upper surface of the epitaxial layer 2 is, for example, about 0.1 to 0.5 μm. The film thickness of the gate insulating film 9 is, for example, 0.005 to 0.015 μm.

Among the patterns of the semiconductor region constituting the unit cell, the number of trenches 8 existing on the body layer 3 extending in the Y direction in a plan view can be arbitrarily set in consideration of the balance between the channel resistance and the JFET resistance as long as the number is at least 1 or more.

The preferable range of the impurity concentration of the n' type SiC substrate 1 is, for example, $1\times10^{18}$ to $1\times10^{21}$ cm$^{-3}$. The preferable range of the impurity concentration of the n$^-$ type epitaxial layer 2 is, for example, $1\times10^{14}$ to $1\times10^{17}$ cm$^{-3}$. The preferable range of the impurity concentration of the p-type body layer 3 is, for example, $1\times10^{16}$ to $1\times10^{19}$ cm$^{-3}$. The preferable range of the maximum impurity concentration of the p-type body layer 3 is, for example, $1\times10^{17}$ to $1\times10^{19}$ cm$^{-3}$. The preferable range of the impurity concentration in the n$^{++}$ type source region 5 is, for example, $1\times10^{19}$ to $1\times10^{21}$ cm$^{-3}$. The preferable range of the impurity concentration in the n$^+$ type current diffusion region 6 is, for example, $5\times10^{16}$ to $5\times10^{18}$ cm$^{-3}$. The preferable range of the impurity concentration in the n-type JFET region 4 is, for example, $1\times10^{15}$ to $1\times10^{18}$ cm$^{-3}$. The preferable range of the impurity concentration in the p$^{++}$ type body layer contact region 7 is, for example, the range of $1\times10^{19}$ to $1\times10^{21}$ cm$^{-3}$.

<Effect of the Present Embodiment>

Next, the features and effects of the structure of the SiC power MISFET according to the present embodiment will be described.

In the present embodiment, the unit cells of the SiC power MISFET are not formed in a line shape as in the comparative example shown in FIG. 26, but the unit cells of the SiC power MISFET are formed in an island shape as shown in FIG. 3. That is, each unit cell includes the annular current diffusion region 6 and the annular JFET region 4. In other words, since the high-concentration current diffusion region 6 extending in the X direction is also formed, even if there is no trench 8 on the body layer 3 extending in the X direction, electrons can be diffused from the Y-axis line to the X-axis line with almost no resistance. That is, as a result, the electrons flowing from the source region 5 side through the channel on the lateral surface of the trench 8 to the current diffusion region 6 flow to the drain region side through not only the current diffusion region 6 extending in the Y direction and the JFET region 4 extending in the Y direction, but also flow to the current diffusion region 6 extending in the X direction and the JFET region 4 extending in the X direction, and then flow to the drain region side.

As a result, the entire JFET region 4 is effectively utilized without forming a trench in the body layer 3 extending in the X direction in a plan view, that is, the X-axis line of the body layer 3, and the current paths of the current diffusion region 6 and the JFET region 4 are increased. Therefore, it is possible to reduce the resistance (JFET resistance) of the SiC power MISFET.

Here, the effect of the structure of the SiC power MISFET according to the present embodiment will be described with reference to FIG. 8 showing the result of simulating the resistance reduction effect. FIG. 8 is a graph showing the relationship between the number of trenches and the resistance reduction rate when the ratio of the channel resistance to the JFET resistance is 2:8.

A cell area Acell, the JFET density (JFET number density) Djfet, and the channel density (trench density) Dtr can be calculated by the following Equations 3 to 5, respectively. Ntr is the number of trenches arranged in the Y direction per cell, and when the number of left and right trenches sandwiching the body layer contact region is totaled, the number of trenches per cell is 2×Ntr.

$Acell=2\times(Wstr+Wcon)\times(Ntr\times Ptr+2\times Wstr)$     (Equation 3)

$Djfet=(4\times Wstr+2\times Wcon+Ntr\times Ptr)/(2\times(Wstr+Wcon)\times(Ntr\times Ptr+2\times Wstr))$     (Equation 4)

$Dtr=(2\times Ntr\times Ptr)/(2\times(Wstr+Wcon)\times(Ntr\times Ptr+2\times Wstr))$     (Equation 5)

FIG. 8 shows the resistance reduction effect when the island structure is used, assuming that the ratio of the channel resistance to the JFET resistance is 2:8 in the striped structure. The horizontal axis of the graph shown in FIG. 8 is the number of trenches Ntr (unit: pieces) existing on the Y-axis per cell. The vertical axis of the graph shown in FIG. 8 shows the resistance increase or decrease rate (unit: %) when the resistance of the striped structure is 100%. That is, the resistance increase or decrease rate on the vertical axis is determined by the magnitude of the JFET resistance Rjfet+channel resistance Rch. In FIG. 8, the trial calculation result of the SiC power MISFET having the same striped structure as in the comparative example is shown by a graph in which the diamond-shaped plots are connected, and the trial calculation result of the SiC power MISFET having the same island structure as the present embodiment is shown by a graph in which the triangular plots are connected. The graph shown by connecting the square plots in FIG. 8 is a trial calculation result in the SiC power MISFET having a butterfly structure described later in Embodiment 2.

In a high withstand voltage element having a withstand voltage (rated withstand voltage) of 3.3 kV or the like, it is considered that the ratio of the channel resistance to the JFET resistance is 2:8 as described above. Regarding the calculation results of the above graph, the design parameters such as the JFET width or the margin are designed to be the same among the striped structure, the island structure, and the butterfly structure.

Since the magnitude of the decrease in JFET resistance due to the increase in JFET density is larger than the magnitude of the increase in channel resistance due to the decrease in the number of channels due to the decrease in the number of trenches, the total resistance at Ntr=10 becomes the minimum value, and the resistance can be reduced by about 10% in the SiC power MISFET having an island structure as compared with the SiC power MISFET having a striped structure. If the ratio of channel resistance is further reduced by reducing the distance between trenches, the resistance can be expected to be reduced by, for example, 30%.

Here, as shown in FIG. 3, the trenches 8 are arranged only on the Y-axis line of the body layer 3 and not on the X-axis line of the body layer 3, so that the direction of the channel current is unified in the X direction. In the SiC power MISFET, the threshold voltage of the transistor and the mobility of the carrier vary depending on the crystal plane in which the channel exists. The variation in the crystal plane in which the channel exists exacerbates the trade-off between the leakage current and the resistance of the SiC power MISFET in the off state. In the present embodiment, it is possible to increase the area of the JFET region 4 through which the current flows and to reduce the JFET resistance while avoiding these adverse effects. Further, since the number of trenches 8 formed is small and the extending directions of the trenches 8 are unified, the yield can be improved as compared with the case where trenches extending in different directions are mixed.

Furthermore, by utilizing the high-dimensional structure, the JFET width can be changed in the X and Y directions, or by adding a Schottky barrier diode (SBD) function, it is possible to give new functionality not found in the striped structure. For example, since there is no trench in the X-axis line, the JFET width can be widened only in the X-axis line where it is not necessary to consider the electric field in the vicinity of the trench 8 to greatly reduce the resistance. Further, by controlling the avalanche breakdown position of the element on the X-axis line where the channel does not exist, it is possible to prevent the induced breakdown of the insulating film. The provision of the SBD will be described later in Modifications 1 and 2 of the present embodiment.

Further, in the island structure in the DMOS having no trench, the insulating film electric field between the island-shaped unit cells (gap of the island structure) becomes large, and the insulating film reliability is low due to the difficulty of predicting the electric field. On the other hand, in the trench type DMOS that can adopt the electric field relaxation layer of PTL 2, the insulating film electric field between the island-shaped unit cells (gap of the island structure) is almost 0 and it is possible to improve the performance without lowering the reliability.

From the above, according to the structure of the present embodiment, it is possible to provide a SiC power MISFET having high reliability and high performance by reducing the JFET resistance while maintaining the advantage of the trench type DMOS that the reliability against the dielectric breakdown of the trench bottom at the time of off is high. That is, the reliability and performance of the silicon carbide semiconductor device can be improved. Further, it is possible to provide a SiC power MISFET in which new functions such as control of an avalanche breakdown position and suppression of the deterioration of energization can be easily implemented.

In the present embodiment, it has been described that the current diffusion region 6 is formed in an annular shape, but since the JFET resistance can be reduced if the current diffusion region 6 extending in the X direction is formed, the X-axis line of the current diffusion region 6 may be interrupted in the middle. The JFET region 4 and the body layer 3 are in contact with each other at a portion where the current diffusion region 6 is interrupted in a plan view.

<Manufacturing Method of Silicon Carbide Semiconductor Device>

The silicon carbide semiconductor device according to the present embodiment can be basically manufactured by a procedure based on the manufacturing methods described in PTLs 1 and 2. Since the only point to be changed is the mask used for photolithography, it is possible to improve the performance of the SiC power MISFET without the need to introduce a special process.

<Modification 1>

Hereinafter, the silicon carbide semiconductor device of Modification 1 of the present embodiment will be described with reference to FIGS. 9 and 10. FIG. 9 is a plan view showing a silicon carbide semiconductor device of the present modification. FIG. 10 is a cross-sectional view showing the silicon carbide semiconductor device of the present modification. FIG. 10 is a cross-sectional view taken along the line C-C of FIG. 9.

As shown in FIGS. 9 and 10, here, a plug (conductive connection portion) 14 for forming a Schottky barrier diode (SBD) is formed. The plug 14 penetrates a laminated film composed of the interlayer insulating film 11 and the gate insulating film 9 and is separated from the gate electrode 10. Further, the bottom surface of the plug 14 is connected to the upper surface of the JFET region 4, and the plug 14 and the source plug 12 are electrically connected to the source wiring electrode 106 (see FIG. 1) in parallel.

The plug 14 is formed directly above the JFET regions 4 at both ends in the X direction of the unit cell and extends in the Y direction. For example, the plugs 14 of the unit cells adjacent to each other in the Y direction are connected to each other. Unlike the structure shown in FIG. 7, here, the gate electrode 10 is not formed directly above the upper surface of the JFET region 4 at both ends in the X direction of the unit cell. The junction between the plug 14 and the JFET region 4 is a Schottky junction. Therefore, the plug 14 and the JFET region 4 form an SBD. The plug 14 may be in contact with the current diffusion region 6 in addition to the JFET region 4.

If the SBD is used as the current path when operating in the reverse direction, the operation mode can be changed from the bipolar of the pn diode to the unipolar of the SBD, and the deterioration of performance and reliability due to the expansion of stacking faults can be prevented.

When manufacturing the silicon carbide semiconductor device having the above-mentioned SBD function, the plug 14 may be formed in a process different from the process of forming the source plug 12. That is, first, a through hole for opening the interlayer insulating film 11 is formed directly above each of the body layer contact region 7 and the source region 5 in the central portion of the island structure.

Subsequently, a silicide layer that is ohmically connected to each of the body layer contact region 7 and the source region 5 is formed at the bottom of the through hole. Next, a through hole that opens directly above the JFET region 4 extending in the Y direction is formed, and then a conductor film that embeds the above two types of through holes is formed without forming a silicide layer. As a result, the source electrode made of the conductor film is ohmically connected to each of the body layer contact region 7 and the source region 5 and is connected to the JFET region 4 by a Schottky junction. This makes it possible to manufacture a silicon carbide semiconductor device in which the SBD function is provided only in a desired portion.

<Modification 2>

As shown in FIG. 11, a plug 15 for forming the SBD may be formed directly above the JFET region 4 extending in the X direction. FIG. 11 is a plan view showing a silicon carbide semiconductor device of the present modification.

Here, the plug 15 for forming the SBD is formed at a position aligned with the source plug 12 in the Y direction. That is, the plug 15 is formed directly above the JFET regions 4 at both ends in the Y direction of the unit cell. The plug 15 may be in contact with the current diffusion region 6 in addition to the JFET region 4.

In this modification, the same effect as that of Modification 1 of the present embodiment can be obtained. The silicon carbide semiconductor device of the present modification can be formed by the same manufacturing process as that of Modification 1 of the present embodiment.

Embodiment 2

FIG. 12 is a graph showing the relationship between the number of trenches and the resistance reduction rate when the ratio of the channel resistance to the JFET resistance is 4:6. That is, FIG. 12 shows the resistance reducing effect of the island-structured SiC power MISFET with respect to the striped SiC power MISFET, assuming the ratio of the channel resistance to the JFET resistance in the striped SiC power MISFET is 4:6.

The horizontal axis of the graph shown in FIG. 12 is the number of trenches Ntr (unit: pieces) existing on the Y-axis per cell. The vertical axis of the graph shown in FIG. 12 shows the resistance increase or decrease rate (unit: %) when the resistance of the striped structure is 100%. In FIG. 12, the trial calculation result of the SiC power MISFET having the same striped structure as in the comparative example is shown by a graph in which circle plots are connected, and the trial calculation result of the SiC power MISFET having the same island structure as in Embodiment 1 is shown by a graph in which triangular plots are connected. Further, in FIG. 12, as in the present embodiment, the trial calculation result in the SiC power MISFET having the butterfly structure described later is shown by a graph in which square plots are connected.

In a low withstand voltage element having a withstand voltage (rated withstand voltage) of 600 V or the like, the ratio of the channel resistance to the JFET resistance is considered to be 4:6 as described above. Regarding the calculation results of the above graph, the design parameters such as the JFET width or the margin are designed to be the same among the striped structure, the island structure, and the butterfly structure.

From FIG. 12, it can be seen that in a low withstand voltage element having a large ratio of the channel resistance Rch, a large reduction in resistance cannot be expected due to an increase in channel resistance Rch. That is, since the SiC power MISFET according to Embodiment 1 reduces the JFET resistance Rjfet, the resistance can be effectively reduced in the high withstand voltage element but the effect is small in the low withstand voltage element. Therefore, a structure that can reduce the channel resistance Rch at the same time is required.

<Structure of Silicon Carbide Semiconductor Device>

Hereinafter, the SiC power MISFET of the present embodiment will be described with reference to FIGS. 13 to 15. FIG. 13 is a bird's-eye view of the SiC power MISFET of the present embodiment. FIGS. 14 and 15 are plan views of the SiC power MISFET of the present embodiment.

As shown in FIGS. 13 to 15, unlike the unit cell of Embodiment 1, in the present embodiment, a body layer contact region 17 is arranged only in the center in the Y direction in the unit cell of the island structure, and the source plug 12 electrically connected to the source wiring electrode 106 (see FIG. 1) is connected to the epitaxial layer 2 only at the center in the Y direction in the unit cell of the island structure. In the following, as in the present embodiment, the structure in which the source plug 12 is not arranged between two trenches arranged in the longitudinal direction (X direction) of the trench, but one trench is formed so as to connect between the left and right current diffusion regions is called a butterfly structure. Here, the unit cells do not extend long in the Y direction as in the comparative example (see FIG. 26), and a plurality of unit cells are arranged side by side in the Y direction and other directions. That is, the unit cell of the present embodiment has an island structure and a butterfly structure.

That is, the unit cell of the SiC power MISFET of the present embodiment includes a source region 25 extending in the Y direction in a plan view, a pair of body layer contact regions 17 arranged so as to sandwich the central portion in the Y direction of the source region 25 in the X direction, and a body layer 23 formed so as to surround a portion other than the portion where the body layer contact regions 17 are in contact with the source region 25 in a plan view. That is, the body layer 23 is divided into two by the body layer contact region 17 in a plan view, and each of the two body layer contact regions 17 is in contact with both of the pair of body layers 23 in a plan view. In other words, the source region 25 is completely surrounded by the body layer contact region 17 and the body layer 23. Further, the unit cell includes the annular current diffusion region 6 and the JFET region 4 that sequentially surround the source region 25, the body layer contact region 17, and the body layer 23 in a plan view. Further, the unit cell includes a plurality of trenches 18, which are formed adjacent to the pair of body layer contact regions 17 in the Y direction and over the source region 25 and the body layer 23 sandwiching the source region 25 in the X direction, and have both ends (both lateral surfaces) in the X direction in contact with the current diffusion region 6 in a plan view.

The trench 18 extends uninterrupted above each of the body layer 23 and the source region 25 between the source region 25 and the current diffusion region 6 sandwiching the body layer 23 in the X direction. Unlike Embodiment 1, the source region 25 is formed deeper than the trench 18, and the source region 25 is also formed on the bottom surface of the trench 18 in addition to the body layer 23. The source region 25 is in contact with each of the lateral surfaces of the trench 18 facing each other in the X direction. The source plug 12 is electrically connected to the lateral surface (channel forming surface) of the trench 18 via the source region 25. That is, the electrons supplied from the source plug 12 during the operation of the SiC power MISFET flow through the source region 25 that is formed deeper than the trench 18 with respect to the lateral surface of the trench 18 on which the channel is formed, and extends in the Y direction so as to overlap the plurality of trenches 18 in a plan view. The gate electrode 10 is formed so as to completely cover the trench 18. In FIG. 15, the gate electrode 10 is open on the X-axis line of the JFET region 4 but the opening may not be present. However, the plug 15 (see FIG. 11) as described in Modification 2 of Embodiment 1 may be formed in the opening of the gate electrode 10 as shown in FIG. 15 to have an SBD function. Further, the SBD described in Modification 1 of Embodiment 1 may be formed at the end of the unit cell in the X direction.

The number of trenches 18 existing on one lateral side of the source plug 12 in the Y direction does not have to be the same as the number of trenches 18 existing on the other lateral side of the source plug 12 in the Y direction. Therefore, the number of trenches 18 possessed by the unit cell may be odd or even, and the degree of freedom in the number of trenches 18 is not impaired. However, since the gate controllability of the trench 18 far from the body layer contact region 17 is lowered, it is desirable that the difference in the number of trenches 18 is small.

According to such a butterfly structure, the width (cell pitch) of the unit cell in the X direction can be reduced by not forming the source plug extending in the Y direction at the center of the unit cell of the island structure. Since the source plug 12 needs to have a wider dimension than the semiconductor region (impurity region) and a thick insulating film needs to be formed between the gate electrode and the source plug, the cell pitch in the X direction can be reduced by 30 to 40% by arranging the source plug 12 as in the present embodiment. Further, in the present embodiment, the three-dimensional corners of the trench 18, that is, the corners of the four corners of the bottom surface of the trench 18 are not formed in the source region 5 having a high impurity concentration. Therefore, the withstand voltage between the gate and the source, which is a problem of the trench structure, can be improved.

Next, the simulation results of the resistance reduction effect in the structure of the SiC power MISFET according to the present embodiment will be described with reference to FIGS. 8 and 12.

According to the butterfly structure of the present embodiment, the channel density and the JFET density can be increased at the same time by reducing the cell pitch, so that the resistance can be significantly reduced. In an element with Rch:Rjfet=2:8 (for example, a high withstand voltage element) as shown in FIG. 12, a resistance reduction of 40% is expected. Even with an element of Rch:Rjfet=4:6 (for example, a low withstand voltage element) as shown in FIG. 8, a resistance reduction effect can be expected when Ntr=5 or more, and a maximum resistance reduction of 30% can be expected. From Ntr=15, since the channel density is higher than that of the striped structure of the comparative example, it is possible to reduce the resistance by up to 30%.

If Ntr is too large, the distance between the trench and the body layer contact region will increase, and the body potential will separate from the source potential. Therefore, it is desirable that the Ntr is 16 or less as a realistic range that does not affect the operation of the SiC power MISFET. In that case, resistance can be reduced by about 28% even with Rch:Rjfet=4:6.

According to the present embodiment, the same effect as that of Embodiment 1 can be obtained, and further, the withstand voltage between the gate and the source, which is a problem of the element having a trench structure, is improved and the channel resistance can be reduced at the same time together with the larger reduction of the JFET resistance. Furthermore, by reducing the cell pitch, it is possible to reduce the channel-on voltage at the time of a short circuit, improve thermal diffusivity and temperature uniformity, and improve the trade-off between on-resistance and short-circuit tolerance. From the above, with the butterfly structure of the present embodiment, it is possible to provide a highly reliable, high-performance, and highly functional SiC power MISFET that can significantly reduce the resistance and implement the functionality while maintaining the high reliability of the trench type DMOS having the striped structure of the comparative example, and further improve dynamic reliability such as short-circuit tolerance when compared with the reliability of the DMOS having no trench.

<Manufacturing Method of Silicon Carbide Semiconductor Device>

Since the only difference between Embodiment 1 and the present embodiment is the planar layout of the silicon carbide semiconductor device, the silicon carbide semiconductor device according to the present embodiment can be manufactured by the same process as that of Embodiment 1.

Embodiment 3

In Embodiment 3, reducing the resistance of the SiC power MISFET having a striped structure instead of the island structure will be described with reference to FIG. 16. FIG. 16 is a plan view of the SiC power MISFET, which is the silicon carbide semiconductor device of the present embodiment. Here, the region in which the X-axis lines of each of the current diffusion region and the JFET are formed in Embodiment 2 is used as the source region, the body layer, and the trench forming portion, and the source region and the body layer are connected to each other between the unit cells adjacent to each other in the Y direction and the unit cell has a striped structure.

That is, the plurality of unit cells arranged in the Y direction have a structure in which one source region 35 extending in the Y direction and one body layer 33 extending in the Y direction are shared, and a current diffusion region 36 and a JFET region 34 have a line shape extending in the Y direction instead of an annular shape. That is, one unit cell includes the source region 35 extending in the Y direction, a pair of body layer contact regions 17 adjacent to the source region 35 in the X direction and sandwiching the source region 35, and the body layer 33 adjacent to the lateral surface of the source region 35 in the X direction other than the portion in which the source region 35 and the body layer contact region 17 are in contact with each other and extending in the Y direction. Further, one unit cell includes a current diffusion region 36 which is adjacent to the lateral surface opposite to the source region 35 side among the lateral surfaces of the source region 35 and the lateral surface of the body layer 33 and extends in the Y direction, and a JFET region 34 which sandwiches the source region 35, the body layer contact region 17, the body layer 3, and the current diffusion region 36 in the X direction and extends in the Y direction in contact with the lateral surface of the current diffusion region 36. Further, one unit cell includes the trench 18 which is formed adjacent to the pair of body layer contact regions 17 in the Y direction and over the source region 35 and the body layer 33 sandwiching the source region 35 in the X direction to be in contact with the current diffusion region 6 in a plan view.

In the present embodiment, the increase in JFET density is limited to the decrease in cell pitch as compared with Embodiment 2. That is, as compared with the comparative example shown in FIG. 26, the cell pitch in the X direction can be reduced by arranging the body layer contact region 17 only in the center in the Y direction in the unit cell having the striped structure. As a result, the JFET density can be increased, which can reduce the JFET resistance. On the other hand, as compared with Embodiment 2, the number of trenches 18 can be increased, so that the channel density can be further improved. In a low withstand voltage element in which the JFET resistance is sufficiently small and the channel resistance is dominant, this structure can effectively reduce the resistance. Further, since there is no intersection between the Y-axis line and the X-axis line in the JFET region, high reliability can be expected.

From the above, according to the structure of Embodiment 3, it is possible to provide a highly reliable and high-performance SiC power MISFET that can significantly reduce especially the channel resistance while maintaining the high reliability of the striped trench type DMOS similar to that of the comparative example, and further improve dynamic reliability such as the short-circuit tolerance, and the like.

The silicon carbide semiconductor device of the present embodiment can be manufactured by the same process as that of Embodiment 1.

Embodiment 4

Hereinafter, the arrangement of a plurality of unit cells of the SiC power MISFET according to Embodiment 4 will be described with reference to FIGS. 17 to 19. FIGS. 17 to 19 are plan views showing the silicon carbide semiconductor device of the present embodiment. Here, the method of arranging the unit cells of the island-shaped trench type DMOS described in Embodiment 2 will be described, but the unit cell may be the unit cell of the island-shaped trench type DMOS described in Embodiment 1. Further, the structure of the unit cell is not limited to the structure shown in Embodiment 1 and Embodiment 2 and can be applied to a trench type DMOS having a unit cell having an asymmetric cell pitch on the X-axis and the Y-axis. That is, the arrangement of the unit cells of the present embodiment can be applied to, for example, a silicon carbide semiconductor device including an element in which the direction of the channel forming surface is restricted by the plane orientation anisotropy of the plane orientation electron physical characteristics of the channel. In FIGS. 17 and 18, the boundary between adjacent unit cells is indicated by a broken line. The width of the active region shown in FIGS. 18 and 19 in the X direction is only about three times the cell pitch in the X direction of the unit cells, but in reality, more unit cells are arranged side by side in the X direction in the active region.

FIG. 17 shows a plan view of the central portion of the active region of the SiC power MISFET of the present embodiment. A plurality of unit cells of the SiC power MISFET are arranged side by side in the active region. At this time, a plurality of unit cells are arranged side by side in the extending direction (Y direction) of the unit cells. In the region adjacent in the X direction to the plurality of unit cells arranged in the Y direction, the other plurality of unit cells arranged in the Y direction are arranged to be shifted by half the length of the width (cell pitch) of one unit cell in the Y direction, in the extending direction (Y direction) of the unit cells. In other words, the other unit cells adjacent to one unit cell in the X direction are arranged at positions shifted by half a cycle of the cell pitch in the Y direction of one unit cell, in the Y direction. Here, since a unit cell long in the Y direction is used, an offset of half the cell pitch is provided in the Y direction. The magnitude of the offset amount Ly here is the same as half the length (half cycle) of the cell pitch in the Y direction of the unit cell. When using a unit cell long in the X direction, an offset of half the cell pitch is provided in the X direction.

When an island structure is adopted in the SiC power MISFET, the effective JFET width becomes large at a unit cell intersection 40, the electric field non-uniformity becomes strong, the decrease in avalanche withstand voltage or the increase in insulating film electric field occurs, which makes the reliability of the SiC power MISFET deteriorated. Therefore, it is necessary to arrange the unit cells so as to minimize the electric field non-uniformity. The unit cell intersection 40 is a point where the largest number of unit cells are in contact with each other in a plan view, and is, for example, a point farthest from the center of a predetermined unit cell in a plan view.

Since the cell pitch of the trench type DMOS is different between the X direction and the Y direction, the offset can be geometrically provided in either the X direction or the Y direction. However, since the electric field non-uniformity depends on the distance between the unit cell intersections 40, the distance can be set to be larger due to the offset as the cell pitch in the axial direction is longer, which is preferable. That is, as the distance between the unit cell intersections 40 increases, the electric field non-uniformity can be reduced. Further, when the unit cells adjacent to each other in the X direction are offset in the Y direction as in the present embodiment, the electric field non-uniformity can be minimized by setting the offset amount Ly to half the cell pitch in the Y direction. Therefore, it is possible to prevent a decrease in the avalanche withstand voltage or an increase in the insulating film electric field, and thus, the reliability of the silicon carbide semiconductor device can be improved.

FIG. 18 shows a plan view of a terminal portion (corner portion) of the active region of the SiC power MISFET of the present embodiment. A body layer 43 is formed on the upper surface of the epitaxial layer outside the terminal portion of the active region. That is, the active region is surrounded by the body layer 43. At the terminal portion of the active region in the non-offset axial direction (X direction in FIG. 18), a half cycle of the unit cell having an island structure is arranged and terminated. At the end of the active region in the offset axial direction (Y direction in FIG. 18), one unit cell and unit cells for half a cycle of the island structure in the Y direction are arranged alternately in the X direction.

A current diffusion region 46 and a JFET region 44 are formed in the indicated order from the terminal portion of the active region in the Y direction toward the central portion of the active region. The current diffusion region 46 is integrated with the current diffusion region 46 of the unit cell for half a cycle formed at the terminal portion of the active region in the Y direction. Further, the JFET region 44 is adjacent to the JFET region 44 of the unit cell in the active region.

Further, the source region 45 and the body layer contact region 47 of the unit cell for half a cycle formed at the terminal portion of the active region in the Y direction, and the body layer 43 below the source region 45 and the body layer contact region 47, respectively, have reached the terminal portion. The JFET width Wjfety of the JFET region 44 at the terminal portion may be different from the JFET width Wjfety of the unit cell, but even if the value is the same as that of the unit cell, the electric field uniformity is higher than that of the unit cell intersection 40 (see FIG. 17). Therefore, the reliability does not decrease. This is because when the destruction occurs, the unit cell intersection 40 is destroyed first. Here, the potential of the terminal portion can be fixed and the contact area can be increased by extending and connecting the source region 45 and the body layer contact region 47 of the unit cell, which are interrupted in a half cycle at the terminal portion, to the body layer 43.

FIG. 19 shows a plan view of the SiC power MISFET of the present embodiment including the gate electrode and the source plug at the terminal portion of the active region. As shown in FIG. 19, the gate electrode 10 and the source plug 12 formed at the terminal portion of the active region are formed directly above the body layer 43 adjacent to the terminal portion of the active region from the inside of the active region in each of the X and Y directions. That is, each part of the gate electrode 10 and the source plug 12 formed within the active region overlaps the body layer 43 in a plan view outside the active region. By overlapping the electrodes on the terminal portion in this way, it is possible to improve the yield and fix the terminal portion potential. Therefore, the manufacturing cost of the silicon carbide semiconductor device can be reduced and the reliability of the silicon carbide semiconductor device can be improved.

Further, according to such a terminal structure, the current diffusion region 46 is arranged at the terminal portion of the active region, and the current diffusion region 46 is connected to the current diffusion region 46 of the unit cell in the vicinity of the terminal portion. Thereby, the current can be diffused even in the terminal portion and the JFET region can be utilized to the maximum extent to reduce the resistance (JFET resistance) of the SiC power MISFET.

As described above, according to the present embodiment, it is possible to prevent a decrease in reliability due to the application of the island structure and to realize a low-loss and high-performance SiC power MISFET while maintaining high reliability.

Embodiment 5

The silicon carbide semiconductor device having the SiC power MISFET described in Embodiments 1 to 4 can be used as a power conversion device. A power conversion device according to Embodiment 5 will be described with reference to FIG. 20. FIG. 20 is a circuit diagram showing an example of the power conversion device (inverter) according to the present embodiment.

As shown in FIG. 20, an inverter 302 includes a SiCMISFET 304, which is a switching element, and a diode 305. The SiCMISFET 304 is the SiC power MISFET described in Embodiments 1 to 4 and includes a built-in diode. In each single phase, the SiCMISFET 304 and the diode 305 are connected in antiparallel between the power supply voltage (Vcc) and the input potential of a load (for example, the motor) 301 (upper arm), and the SiCMISFET 304 and the diode 305 are also connected in antiparallel between the input potential of the load 301 and the ground potential (GND) (lower arm).

That is, in the load 301, two SiCMISFETs 304 and two diodes 305 are provided in each single phase, and six SiCMISFETs (switching elements) 304 and six diodes 305 are provided in three phases. A control circuit 303 is connected to the gate electrode of each SiCMISFET 304, and the SiCMISFET 304 is controlled by the control circuit 303. Therefore, the load 301 can be driven by controlling the current flowing through the SiCMISFET 304 constituting the inverter 302 with the control circuit 303. The SiCMISFET 304 and the diode 305, which are connected in antiparallel to each other, are, for example, separate elements and are not mounted in the same semiconductor chip.

The functions of the SiCMISFET 304 constituting the inverter 302 will be described below. In order to control and drive the load 301, for example, the motor, it is necessary to input a sine wave of a desired voltage to the load 301. The control circuit 303 controls the SiCMISFET 304 and performs a pulse width modulation operation that dynamically changes the pulse width of the square wave. The output square wave is smoothed by passing through the inductor to become a pseudo desired sine wave. The SiCMISFET 304 has the function of creating a square wave for performing this pulse width modulation operation.

As described above, according to the present embodiment, the SiCMISFET 304 uses the silicon carbide semiconductor device with low on-resistance and high withstand voltage described in Embodiments 1 to 4. As described above, since the SiCMISFET 304 has high performance, it is possible to improve the performance of a power conversion device such as an inverter. Further, since the SiCMISFET 304 has long-term reliability, the number of years of use of a power conversion device such as an inverter can be extended.

Further, the power conversion device can be used for a three-phase motor system. When the load 301 shown in FIG. 20 is a three-phase motor, it is possible to achieve high performance and long-term use of a three-phase motor system by using a power conversion device including the silicon carbide semiconductor device described in Embodiments 1 to 4 for the inverter 302.

Embodiment 6

The silicon carbide semiconductor device including the SiC power MISFET described in Embodiments 1 to 4 can be used as a power conversion device. The power conversion device according to Embodiment 6 will be described with reference to FIG. 21. FIG. 21 is a circuit diagram showing an example of a power conversion device (inverter) according to the present embodiment.

As shown in FIG. 21, the inverter 402 includes a SiCMISFET 404, which is a switching element. In each single phase, the SiCMISFET 404 is connected between the power supply voltage (Vcc) and the input potential of a load (for example, motor) 401 (upper arm), and the SiCMISFET 404 is also connected between the input potential of the load 401 and the ground potential (GND) (lower arm). That is, in the load 401, two SiCMISFETs 404 are provided in each single phase, and six SiCMISFETs (switching elements) 404 are provided in three phases. A control circuit 403 is connected to the gate electrode of each SiCMISFET 404 and the SiCMISFET 404 is controlled by this control circuit 403. Therefore, the load 401 can be driven by controlling the current flowing through the SiCMISFET 404 constituting the inverter 402 with the control circuit 403.

The functions of the SiCMISFET 404 constituting the inverter 402 will be described below. Also in the present embodiment, as one of the functions of the SiCMISFET, the SiCMISFET has a function of creating a square wave for performing a pulse width modulation operation as in Embodiment 5. Further, in the present embodiment, the SiCMISFET also plays the role of the diode 305 of Embodiment 5. In the inverter 402, for example, when the load 401 includes an inductance like a motor and the SiCMISFET 404 is turned off, the energy stored in the inductance has to be released (recirculation current). In Embodiment 5, the diode 305 plays this role. In this way, the diode 305 is used as a recirculation diode. On the other hand, in the present embodiment, the SiCMISFET 404 plays this role. That is, a synchronous rectification drive is used. Here, the synchronous rectification drive is a method in which the gate of the SiCMISFET 404 is turned on at the time of recirculation to reverse-conduct the SiCMISFET 404.

Therefore, the conduction loss at recirculation is determined not by the characteristics of the diode but by the characteristics of the SiCMISFET 404. Further, when the synchronous rectification drive is performed, a non-operation time is required in which both the upper and lower SiCMISFETs 404 are turned off in order to prevent the upper and lower arms from being short-circuited. During this non-operation time, the built-in PN diode composed of the n-type drift layer and the p-type body layer of the SiCMISFET 404 is driven. However, SiC has a shorter carrier mileage than Si and the loss during non-operation time is small. For example, it is equivalent to the case where the diode 305 of Embodiment 2 is a SiC Schottky barrier diode.

As described above, according to the present embodiment, by using the silicon carbide semiconductor device described in Embodiments 1 to 4 for the SiCMISFET 404, for example, the high performance of the SiCMISFET 404 can also reduce the loss during recirculation. Further, since a diode is not used except for the SiCMISFET 404, the power conversion device such as an inverter can be miniaturized. Further, since the SiCMISFET 404 has long-term reliability, the number of years of use of a power conversion device such as an inverter can be extended.

Further, the power conversion device can be used for a three-phase motor system. When the load 401 shown in FIG. 21 is a three-phase motor, it is possible to realize the high performance and long use time of the three-phase motor system by using the power conversion device provided with the silicon carbide semiconductor device described in Embodiments 1 to 4 for the inverter 402.

Embodiment 7

The three-phase motor system described in Embodiment 5 or 6 can be used in an automobile such as a hybrid automobile, an electric vehicle, or a fuel cell vehicle. The automobile using the three-phase motor system according to Embodiment 7 will be described with reference to FIGS. 22 and 23. FIG. 22 is a schematic diagram showing an example of the configuration of the electric vehicle according to the present embodiment, and FIG. 23 is a circuit diagram showing an example of a boost converter according to the present embodiment.

As shown in FIG. 22, the electric vehicle includes a three-phase motor 503 that can input and output power to a drive shaft 502 to which a drive wheel (wheel) 501a and a drive wheel (wheel) 501b are connected, an inverter 504 for driving the three-phase motor 503, and a battery 505. Further, the electric vehicle includes a boost converter 508, a relay 509, and an electronic control unit 510, and the boost converter 508 is connected to a power line 506 to which the inverter 504 is connected and a power line 507 to which the battery 505 is connected.

The three-phase motor 503 is a synchronous generator motor including a rotor in which a permanent magnet is embedded and a stator in which a three-phase coil is wound. As the inverter 504, the inverter described in Embodiment 5 or 6 can be used. The synchronous generator motor receives power supplied from the inverter to drive the drive wheels 501a and 501b.

As shown in FIG. 23, the boost converter 508 has a configuration in which a reactor 511 and a smoothing capacitor 512 are connected to the inverter 513. The inverter 513 is, for example, the same as the inverter described in Embodiment 6 and the element configuration in the inverter is also the same. In the present embodiment, for example, it is shown in a diagram composed of a SiCMISFET 514 as in Embodiment 6.

The electronic control unit 510 of FIG. 22 includes a microprocessor, a storage device, and an input and output port, and receives a signal from a sensor that detects the rotor position of the three-phase motor 503, a charge and discharge value of the battery 505, and the like. Then, a signal for controlling the inverter 504, the boost converter 508, and the relay 509 is output.

As described above, according to the present embodiment, the power conversion device described in Embodiment 5 or 6 can be used for the inverter 504 and the boost converter 508, which are the power conversion devices. Further, the three-phase motor system described in Embodiment 5 or 6 can be used for the three-phase motor system including the three-phase motor 503 and the inverter 504. As a result, it is possible to achieve energy saving, downsizing, weight reduction, and space saving of the electric vehicle.

Although the electric vehicle has been described in the present embodiment, the three-phase motor system of each of the above-described embodiments is also similarly applied to the hybrid vehicle in which the engine is also used and the fuel cell vehicle in which the battery 505 is a fuel cell stack.

Embodiment 8

The three-phase motor system described in Embodiment 5 or 6 can be used for a railway vehicle. The railway vehicle using the three-phase motor system according to Embodiment 8 will be described with reference to FIG. 24. FIG. 24 is a circuit diagram showing an example of a converter and an inverter provided in a railway vehicle according to the present embodiment.

As shown in FIG. 24, power is supplied to the railway vehicle from an overhead wire OW (for example, 25 kV) via a pantograph PG. The voltage is stepped down to 1.5 kV via a transformer 609 and converted from alternating current to direct current by a converter 607. Further, the direct current is converted to alternating current by the inverter 602 via a capacitor 608 to drive the three-phase motor, which is a load 601. That is, the three-phase motor (electric motor), which is the load 601, receives the power supplied from the inverter 602 to drive wheels WH.

The element configuration in the converter 607 may be a combination of a SiCMISFET and a diode as in Embodiment 5, or a single SiCMISFET as in Embodiment 6. In this embodiment, for example, a diagram composed of a SiCMISFET 604 as in Embodiment 6 is shown. In FIG. 24, the control circuit described in Embodiment 5 or 6 is omitted. Further, in the drawing, the reference numeral RT indicates a rail line. The overhead wire OW and a rail line RT are electrically connected via the pantograph PG, the transformer 609, and the wheel WH.

As described above, according to the present embodiment, the power conversion device described in Embodiment 5 or 6 can be used for the converter 607. Further, the three-phase motor system described in Embodiment 5 or 6 can be used for the three-phase motor system including the load 601, the inverter 602, and the control circuit. As a result, it is possible to save energy in railway vehicles and to reduce the size and weight of underfloor parts.

Although the inventions made by the present inventors have been specifically described above based on the embodiments, it is needless to say that the present invention is not limited to the above embodiments and can be variously modified without departing from the gist thereof.

For example, it is needless to say that the material, conductive type, manufacturing conditions, and the like of each unit are not limited to the description of the above-described embodiments and various modifications thereof can be made. Here, for convenience of explanation, the conductive type of the semiconductor substrate and the semiconductor film has been fixed and described, but the present invention is not limited to the conductive type described in the above-described embodiments.

INDUSTRIAL APPLICABILITY

The present invention can be widely used in silicon carbide semiconductor devices, and power conversion devices, three-phase motor systems, automobiles, and railway vehicles equipped with the same.

REFERENCE SIGNS LIST

1 SiC substrate
2 epitaxial layer
3 body layer
4 JFET region
5 source region
6 current diffusion region
7 body layer contact region
8 trench
9 gate insulating film
10 gate electrode
12 source plug
13 drain wiring electrode

The invention claimed is:

1. A silicon carbide semiconductor device comprising:
an electric field effect transistor including
a silicon carbide semiconductor substrate of a first conductive type having a first impurity concentration;
a drain electrode electrically connected to the back surface of the silicon carbide semiconductor substrate;
a semiconductor layer of the first conductive type formed on the silicon carbide semiconductor substrate and having a second impurity concentration lower than the first impurity concentration;
a first semiconductor region comprising a body layer region formed from the upper surface of the semiconductor layer at an inside of the semiconductor layer and having a second conductive type different from the first conductive type;
a second semiconductor region of the first conductive type formed from the upper surface of the first semiconductor region at an inside of the first semiconductor region;
a third semiconductor region of a second conductive type formed from the upper surface of the first semiconductor region at the inside of the first semiconductor region, adjacent to the second semiconductor region, and electrically connected to the first semiconductor region;
a fourth semiconductor region of the first conductive type formed from the upper surface of the first semiconductor region at the inside of the first semiconductor region separated from the second semiconductor region and the third semiconductor region;
a fifth semiconductor region of the first conductive type formed from the upper surface of the semiconductor layer at the inside of the semiconductor layer in contact with the semiconductor layer and having a third impurity concentration equal to or higher than the second impurity concentration;
a trench formed on the upper surface of the first semiconductor region to be shallower than the first semiconductor region and including a first lateral surface and a second lateral surface facing each other and a third lateral surface intersecting each of the first lateral surface and the second lateral surface;
a gate electrode formed in the trench with a gate insulating film therebetween;
a source electrode formed on the semiconductor layer and electrically connected to the second semiconductor region and the third semiconductor region, wherein
the second semiconductor region is in contact with the first lateral surface or the third lateral surface of the trench, the second lateral surface of the trench is in contact with the fourth semiconductor region, and the third lateral surface of the trench is in contact with the first semiconductor region between the second semiconductor region and the fourth semiconductor region,
the fourth semiconductor region includes a first portion extending in a first direction orthogonal to the third lateral surface of the trench and in contact with the trench and the fifth semiconductor region, and a second portion extending in a second direction orthogonal to the first direction in a plan view and in contact with the fifth semiconductor region,
a plurality of periodic structures each including the first semiconductor region, the second semiconductor region, the third semiconductor region, the fourth semiconductor region, the fifth semiconductor region, and the trench are arranged side by side in the first direction on the upper surface of the semiconductor layer, and
in a plan view, the two first portions and the two second portions form an annular pattern surrounding the second semiconductor region and the third semiconductor region.

2. The silicon carbide semiconductor device according to claim 1, wherein
in a plan view, the fifth semiconductor region forms an annular pattern surrounding the fourth semiconductor region.

3. The silicon carbide semiconductor device according to claim 1, wherein
in a plan view, among the periodic structures adjacent to each other, the first semiconductor region, the second semiconductor region, the third semiconductor region, the fourth semiconductor region, and the trench constituting one of the periodic structures adjacent to each other are not connected to any of the first semiconductor region, the second semiconductor region, the third semiconductor region, the fourth semiconductor region, and the trench constituting another periodic structure, and
the fifth semiconductor regions constituting each of the periodic structures adjacent to each other are connected to each other.

4. The silicon carbide semiconductor device according to claim 1, wherein
the second portion is separated from the trench.

5. The silicon carbide semiconductor device according to claim 1, further comprising:
a first electrode formed on the semiconductor layer and electrically connected to the source electrode, wherein
the first electrode and the fifth semiconductor region are connected by a Schottky junction.

6. The silicon carbide semiconductor device according to claim 1, wherein
the second semiconductor region extends in the first direction and overlaps the plurality of trenches in a plan view, and
both ends in each of the plurality of trenches in the second direction form the periodic structure and are in contact with the two first portions sandwiching the second semiconductor region in a plan view.

7. The silicon carbide semiconductor device according to claim 1, wherein
the periodic structures adjacent to each other in the lateral direction of the periodic structure are arranged at positions shifted by half a cycle in the longitudinal direction of the periodic structure.

8. A power conversion device comprising:
a switching element comprising a silicon carbide semiconductor device including an electric field effect transistor, the silicon carbide semiconductor device comprising
a silicon carbide semiconductor substrate of a first conductive type having a first impurity concentration;
a drain electrode electrically connected to the back surface of the silicon carbide semiconductor substrate;
a semiconductor layer of the first conductive type formed on the silicon carbide semiconductor substrate and having a second impurity concentration lower than the first impurity concentration;
a first semiconductor region comprising a body layer region formed from the upper surface of the semiconductor layer at an inside of the semiconductor layer and having a second conductive type different from the first conductive type;
a second semiconductor region of the first conductive type formed from the upper surface of the first semiconductor region at an inside of the first semiconductor region;
a third semiconductor region of a second conductive type formed from the upper surface of the first semiconductor region at the inside of the first semiconductor region, adjacent to the second semiconductor region, and electrically connected to the first semiconductor region;
a fourth semiconductor region of the first conductive type formed from the upper surface of the first semiconductor region at the inside of the first semiconductor region separated from the second semiconductor region and the third semiconductor region;
a fifth semiconductor region of the first conductive type formed from the upper surface of the semiconductor layer at the inside of the semiconductor layer in contact with the semiconductor layer and having a third impurity concentration equal to or higher than the second impurity concentration;
a trench formed on the upper surface of the first semiconductor region to be shallower than the first semiconductor region and including a first lateral surface and a second lateral surface facing each other and a third lateral surface intersecting each of the first lateral surface and the second lateral surface;
a gate electrode formed in the trench with a gate insulating film therebetween;
a source electrode formed on the semiconductor layer and electrically connected to the second semiconductor region and the third semiconductor region, wherein
the second semiconductor region is in contact with the first lateral surface or the third lateral surface of the trench, the second lateral surface of the trench is in contact with the fourth semiconductor region, and the third lateral surface of the trench is in contact with the first semiconductor region between the second semiconductor region and the fourth semiconductor region,
the fourth semiconductor region includes a first portion extending in a first direction orthogonal to the third lateral surface of the trench and in contact with the trench and the fifth semiconductor region, and a second portion extending in a second direction orthogonal to the first direction in a plan view and in contact with the fifth semiconductor region,
a plurality of periodic structures each including the first semiconductor region, the second semiconductor region, the third semiconductor region, the fourth semiconductor region, the fifth semiconductor region, and the trench are arranged side by side in the first direction on the upper surface of the semiconductor layer, and
in a plan view, the two first portions and the two second portions form an annular pattern surrounding the second semiconductor region and the third semiconductor region.

9. A three-phase motor system for driving a three-phase motor by converting DC power into AC power, the three-phase motor system comprising:
a power conversion device including
a silicon carbide semiconductor device including an electric field effect transistor, the silicon carbide semiconductor device comprising
a silicon carbide semiconductor substrate of a first conductive type having a first impurity concentration;
a drain electrode electrically connected to the back surface of the silicon carbide semiconductor substrate;
a semiconductor layer of the first conductive type formed on the silicon carbide semiconductor substrate and having a second impurity concentration lower than the first impurity concentration;
a first semiconductor region comprising a body layer region formed from the upper surface of the semiconductor layer at an inside of the semiconductor layer and having a second conductive type different from the first conductive type;
a second semiconductor region of the first conductive type formed from the upper surface of the first semiconductor region at an inside of the first semiconductor region;
a third semiconductor region of a second conductive type formed from the upper surface of the first semiconductor region at the inside of the first semiconductor region, adjacent to the second semiconductor region, and electrically connected to the first semiconductor region;

a fourth semiconductor region of the first conductive type formed from the upper surface of the first semiconductor region at the inside of the first semiconductor region separated from the second semiconductor region and the third semiconductor region;

a fifth semiconductor region of the first conductive type formed from the upper surface of the semiconductor layer at the inside of the semiconductor layer in contact with the semiconductor layer and having a third impurity concentration equal to or higher than the second impurity concentration;

a trench formed on the upper surface of the first semiconductor region to be shallower than the first semiconductor region and including a first lateral surface and a second lateral surface facing each other and a third lateral surface intersecting each of the first lateral surface and the second lateral surface;

a gate electrode formed in the trench with a gate insulating film therebetween, a source electrode formed on the semiconductor layer and electrically connected to the second semiconductor region and the third semiconductor region, wherein the second semiconductor region is in contact with the first lateral surface or the third lateral surface of the trench, the second lateral surface of the trench is in contact with the fourth semiconductor region, and the third lateral surface of the trench is in contact with the first semiconductor region between the second semiconductor region and the fourth semiconductor region, the fourth semiconductor region Includes a first portion extending in a first direction orthogonal to the third lateral surface of the trench and in contact with the trench and the fifth semiconductor region, and a second portion extending in a second direction orthogonal to the first direction in a plan view and in contact with the fifth semiconductor region, a plurality of periodic structures each including the first semiconductor region, the second semiconductor region, the third semiconductor region, the fourth semiconductor region, the fifth semiconductor region, and the trench are arranged side by side in the first direction on the upper surface of the semiconductor layer, and in a plan view, the two first portions and the two second portions form an annular pattern surrounding the second semiconductor region and the third semiconductor region.

10. An automobile comprising:

a power conversion device configured to drives wheels of the automobile, the power conversion device including a silicon carbide semiconductor device including an electric field effect transistor, the silicon carbide semiconductor device comprising a silicon carbide semiconductor substrate of a first conductive type having a first impurity concentration;

a drain electrode electrically connected to the back surface of the silicon carbide semiconductor substrate;

a semiconductor layer of the first conductive type formed on the silicon carbide semiconductor substrate and having a second impurity concentration lower than the first impurity concentration;

a first semiconductor region comprising a body layer region formed from the upper surface of the semiconductor layer at an inside of the semiconductor layer and having a second conductive type different from the first conductive type;

a second semiconductor region of the first conductive type formed from the upper surface of the first semiconductor region at an inside of the first semiconductor region;

a third semiconductor region of a second conductive type formed from the upper surface of the first semiconductor region at the inside of the first semiconductor region, adjacent to the second semiconductor region, and electrically connected to the first semiconductor region;

a fourth semiconductor region of the first conductive type formed from the upper surface of the first semiconductor region at the inside of the first semiconductor region separated from the second semiconductor region and the third semiconductor region;

a fifth semiconductor region of the first conductive type formed from the upper surface of the semiconductor layer at the inside of the semiconductor layer in contact with the semiconductor layer and having a third impurity concentration equal to or higher than the second impurity concentration;

a trench formed on the upper surface of the first semiconductor region to be shallower than the first semiconductor region and including a first lateral surface and a second lateral surface facing each other and a third lateral surface intersecting each of the first lateral surface and the second lateral surface;

a gate electrode formed in the trench with a gate insulating film therebetween;

a source electrode formed on the semiconductor layer and electrically connected to the second semiconductor region and the third semiconductor region, wherein the second semiconductor region is in contact with the first lateral surface or the third lateral surface of the trench, the second lateral surface of the trench is in contact with the fourth semiconductor region, and the third lateral surface of the trench is in contact with the first semiconductor region between the second semiconductor region and the fourth semiconductor region, the fourth semiconductor region Includes a first portion extending in a first direction orthogonal to the third lateral surface of the trench and in contact with the trench and the fifth semiconductor region, and a second portion extending in a second direction orthogonal to the first direction in a plan view and in contact with the fifth semiconductor region, a plurality of periodic structures each including the first semiconductor region, the second semiconductor region, the third semiconductor region, the fourth semiconductor region, the fifth semiconductor region, and the trench are arranged side by side in the first direction on the upper surface of the semiconductor layer, and in a plan view, the two first portions and the two second portions form an annular pattern surrounding the second semiconductor region and the third semiconductor region.

11. A railway vehicle comprising:
a power conversion device configured to drive wheels of the railway vehicle, the power conversion device including
a silicon carbide semiconductor device including an electric field effect transistor, the silicon carbide semiconductor device comprising
   a silicon carbide semiconductor substrate of a first conductive type having a first impurity concentration;
   a drain electrode electrically connected to the back surface of the silicon carbide semiconductor substrate;
   a semiconductor layer of the first conductive type formed on the silicon carbide semiconductor substrate and having a second impurity concentration lower than the first impurity concentration;
   a first semiconductor region comprising a body layer region formed from the upper surface of the semiconductor layer at an inside of the semiconductor layer and having a second conductive type different from the first conductive type;
   a second semiconductor region of the first conductive type formed from the upper surface of the first semiconductor region at an inside of the first semiconductor region;
   a third semiconductor region of a second conductive type formed from the upper surface of the first semiconductor region at the inside of the first semiconductor region, adjacent to the second semiconductor region, and electrically connected to the first semiconductor region;
   a fourth semiconductor region of the first conductive type formed from the upper surface of the first semiconductor region at the inside of the first semiconductor region separated from the second semiconductor region and the third semiconductor region;
   a fifth semiconductor region of the first conductive type formed from the upper surface of the semiconductor layer at the inside of the semiconductor layer in contact with the semiconductor layer and having a third impurity concentration equal to or higher than the second impurity concentration;
   a trench formed on the upper surface of the first semiconductor region to be shallower than the first semiconductor region and including a first lateral surface and a second lateral surface facing each other and a third lateral surface intersecting each of the first lateral surface and the second lateral surface;
   a gate electrode formed in the trench with a gate insulating film therebetween;
   a source electrode formed on the semiconductor layer and electrically connected to the second semiconductor region and the third semiconductor region, wherein
   the second semiconductor region is in contact with the first lateral surface or the third lateral surface of the trench, the second lateral surface of the trench is in contact with the fourth semiconductor region, and the third lateral surface of the trench is in contact with the first semiconductor region between the second semiconductor region and the fourth semiconductor region,
   the fourth semiconductor region Includes a first portion extending in a first direction orthogonal to the third lateral surface of the trench and in contact with the trench and the fifth semiconductor region, and a second portion extending in a second direction orthogonal to the first direction in a plan view and in contact with the fifth semiconductor region,
   a plurality of periodic structures each including the first semiconductor region, the second semiconductor region, the third semiconductor region, the fourth semiconductor region, the fifth semiconductor region, and the trench are arranged side by side in the first direction on the upper surface of the semiconductor layer, and
   in a plan view, the two first portions and the two second portions form an annular pattern surrounding the second semiconductor region and the third semiconductor region.

* * * * *